United States Patent
Tsai et al.

(10) Patent No.: US 10,522,501 B2
(45) Date of Patent: Dec. 31, 2019

(54) SEMICONDUCTOR STRUCTURE AND METHOD OF FORMING THE SAME

(71) Applicant: Taiwan Semiconductor Manufacturing Company, Ltd., Hsinchu (TW)

(72) Inventors: Hui-Jung Tsai, Hsinchu (TW); Yun Chen Hsieh, Baoshan Township (TW); Jyun-Siang Peng, Hsinchu (TW); Tai-Min Chang, Taipei (TW); Yi-Yang Lei, Taichung (TW); Hung-Jui Kuo, Hsinchu (TW); Chen-Hua Yu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/028,813

(22) Filed: Jul. 6, 2018

(65) Prior Publication Data
US 2019/0157240 A1   May 23, 2019

Related U.S. Application Data

(60) Provisional application No. 62/587,836, filed on Nov. 17, 2017.

(51) Int. Cl.
| H01L 21/56 | (2006.01) |
| H01L 23/00 | (2006.01) |
| H01L 25/18 | (2006.01) |
| H01L 23/538 | (2006.01) |
| H01L 25/10 | (2006.01) |
| H01L 25/00 | (2006.01) |

(52) U.S. Cl.
CPC .......... *H01L 24/82* (2013.01); *H01L 23/5389* (2013.01); *H01L 24/02* (2013.01); *H01L 24/16* (2013.01); *H01L 24/19* (2013.01); *H01L 24/20* (2013.01); *H01L 24/24* (2013.01); *H01L 24/25* (2013.01); *H01L 25/105* (2013.01); *H01L 25/18* (2013.01); *H01L 25/50* (2013.01); *H01L 2224/0239* (2013.01); *H01L 2224/02313* (2013.01); *H01L 2224/04105* (2013.01); *H01L 2224/12105* (2013.01);
(Continued)

(58) Field of Classification Search
CPC ............. H01L 21/4853; H01L 21/4857; H01L 21/56565; H01L 21/568; H01L 21/6835
See application file for complete search history.

(56) References Cited

U.S. PATENT DOCUMENTS

| 8,361,842 B2 | 1/2013 | Yu et al. |
| 8,680,647 B2 | 3/2014 | Yu et al. |

(Continued)

*Primary Examiner* — Cuong Q Nguyen
(74) *Attorney, Agent, or Firm* — Slater Matsil, LLP

(57) ABSTRACT

A method includes encapsulating a device in an encapsulating material, planarizing the encapsulating material and the device, and forming a conductive feature over the encapsulating material and the device. The formation of the conductive feature includes depositing a first conductive material to from a first seed layer, depositing a second conductive material different from the first conductive material over the first seed layer to form a second seed layer, plating a metal region over the second seed layer, performing a first etching on the second seed layer, performing a second etching on the first seed layer, and after the first seed layer is etched, performing a third etching on the second seed layer and the metal region.

20 Claims, 38 Drawing Sheets

(52) U.S. Cl.
CPC ............... *H01L 2224/13024* (2013.01); *H01L 2224/16227* (2013.01); *H01L 2224/18* (2013.01); *H01L 2224/245* (2013.01); *H01L 2224/24011* (2013.01); *H01L 2224/24137* (2013.01); *H01L 2224/25171* (2013.01); *H01L 2224/32145* (2013.01); *H01L 2224/32225* (2013.01); *H01L 2224/73265* (2013.01); *H01L 2224/73267* (2013.01); *H01L 2224/82106* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/01029* (2013.01); *H01L 2924/15313* (2013.01)

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2005/0208748 A1* | 9/2005 | Srivastava ............... H01L 24/13 438/613 |
| 2005/0274691 A1 | 12/2005 | Park |
| 2006/0060558 A1 | 3/2006 | Maeng et al. |
| 2009/0236686 A1 | 9/2009 | Shim et al. |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2016/0021754 A1* | 1/2016 | Chen ................... H01L 21/6835 361/761 |

* cited by examiner

SEMICONDUCTOR STRUCTURE AND METHOD OF FORMING THE SAME

PRIORITY CLAIM AND CROSS-REFERENCE

This application claims the benefit of the following provisionally filed U.S. Patent application: Application Ser. No. 62/587,836, filed Nov. 17, 2017, and entitled "Three-step Etching to Form RDL;" which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to the region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

In a fan-out package, device dies are encapsulated in a molding compound, which is then planarized to expose the device die. Dielectric layers are formed over the device dies. Redistribution lines are formed in the dielectric layers to connect to the device die. The fan-out package may also include through-vias penetrating through the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
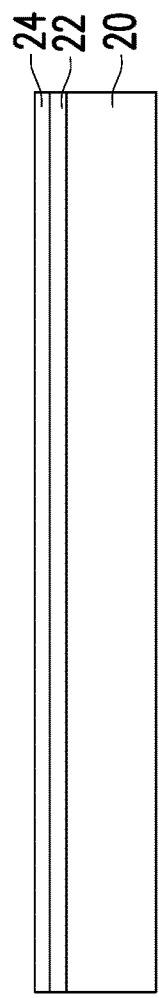
FIGS. 1 through 26 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An Integrated Fan-Out (InFO) package and the method of forming the same are provided in accordance with various exemplary embodiments. The intermediate stages of forming the InFO package are illustrated in accordance with some embodiments. Some variations of some embodiments are discussed. Throughout the various views and illustrative embodiments, like reference numbers are used to designate like elements.

Figure 38:
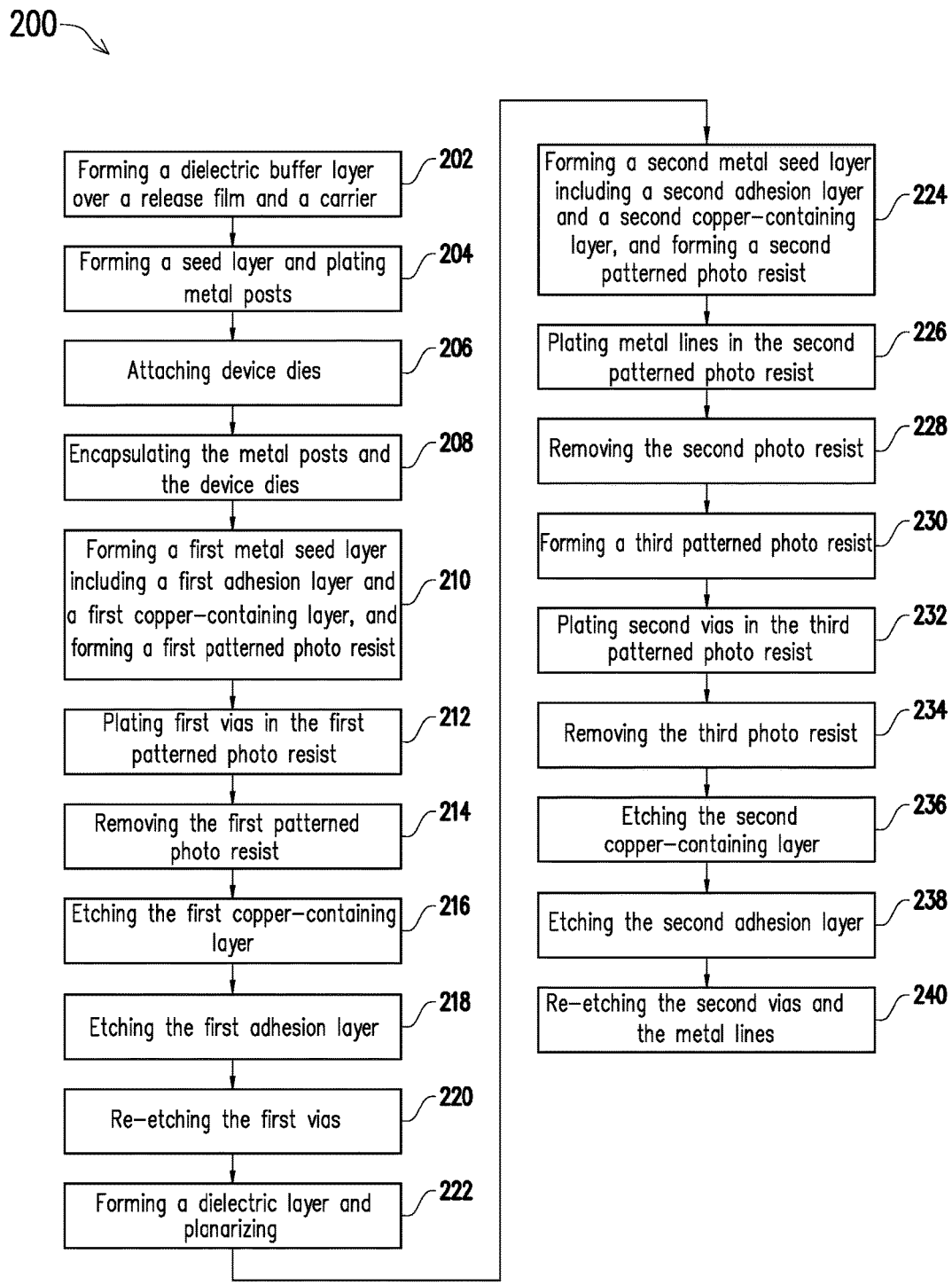
FIG. 38 illustrates a process flow for forming packages in accordance with some embodiments.

FIGS. 1 through 26 illustrate the cross-sectional views of intermediate stages in the formation of a package in accordance with some embodiments. The steps shown in FIG. 1 through 26 are also illustrated schematically in the process flow 200 shown in FIG. 38.

Referring to FIG. 1, carrier 20 is provided, and release film 22 is coated on carrier 20. The respective process is illustrated as step 202 in the process flow shown in FIG. 38. Carrier 20 is formed of a transparent material, and may be a glass carrier, a ceramic carrier, an organic carrier, or the like. Carrier 20 may have a round top-view shape. Release film 22 is in physical contact with the top surface of carrier 20. Release film 22 may be formed of a Light-To-Heat-Conversion (LTHC) coating material, and may be applied onto carrier 20 through coating. In accordance with some embodiments of the present disclosure, the LTHC coating material is capable of being decomposed under the heat of light/radiation (such as laser), and hence can release carrier 20 from the structure formed thereon.

In accordance with some embodiments of the present disclosure, as shown in FIG. 1, dielectric buffer layer 24 is formed on LTHC coating material 22. The respective process is also illustrated as step 202 in the process flow shown in FIG. 38. In accordance with some embodiments, dielectric buffer layer 24 is formed of a polymer such as polybenzoxazole (PBO), polyimide, benzocyclobutene (BCB), or the like.

Figure 2:
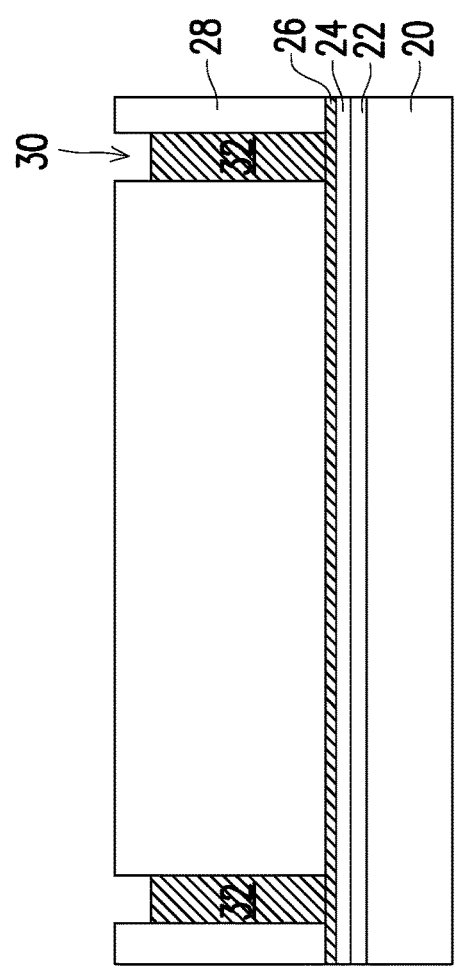
Figure 3:
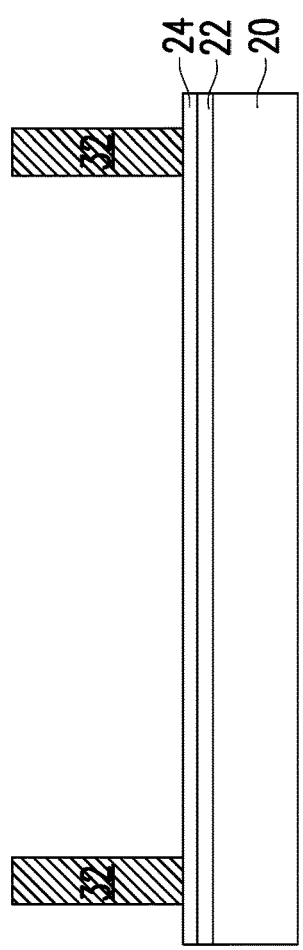

FIGS. 2 and 3 illustrate the formation of metal posts 32. Referring to FIG. 2, metal seed layer 26 is formed, for example, through Physical Vapor Deposition (PVD). The respective process is illustrated as step 204 in the process flow shown in FIG. 38. In accordance with some embodiments of the present disclosure, metal seed layer 26 includes a titanium layer and a copper layer over the titanium layer. Photo resist 28 is formed over metal seed layer 26. A light-exposure is then performed on photo resist 28 using a photo lithography mask (not shown). After a subsequent development, openings 30 are formed in photo resist 28. Some portions of metal seed layer 26 are exposed through openings 30.

Next, metal posts 32 are formed, for example, by plating a metallic material in openings 30. The respective process is also illustrated as step 204 in the process flow shown in FIG. 38. Metal posts 32 are alternatively referred to as through-vias or through-molding vias since they will penetrate through the subsequently formed encapsulating material (which may be a molding compound) in the final package. The plated metallic material may be copper or a copper alloy. The top surfaces of metal posts 32 are lower than the top surface of photo resist 28, so that the shapes of metal posts 32 are confined by openings 30. Metal posts 32 may have substantially vertical and straight edges. Alternatively, metal posts 32 may have a sand timer shape in a cross-sectional view, with the middle parts of metal posts 32 being narrower than the respective top parts and bottom parts.

In a subsequent step, the patterned photo resist 28 is removed, and hence the underlying portions of metal seed layer 26 are exposed. The exposed portions of metal seed layer 26 are then removed in an etching step, for example, in an anisotropic etching step or an isotropic etching step. The edges of the remaining seed layer 26 may thus be co-terminus or substantially co-terminus with the respective overlying portions of metal posts 32, or may be laterally recessed from the respective edges of the respective overlying plated material, hence having undercuts. The resulting metal posts 32 are illustrated in FIG. 3, in which undercuts are not shown. Throughout the description, the remaining portions of metal seed layer 26 (FIG. 3) are considered as parts of metal posts 32. The top-view shapes of metal posts 32 include, and are not limited to, circular shapes, rectangles, hexagons, octagons, and the like. After the formation of metal posts 32, dielectric buffer layer 24 is exposed.

Figure 4:
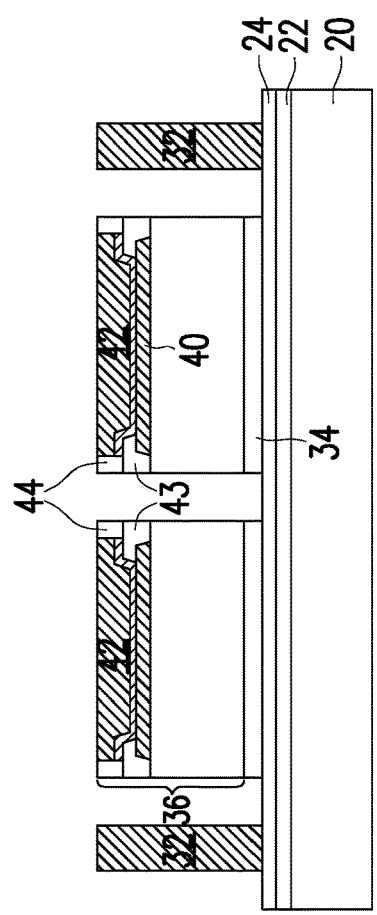

FIG. 4 illustrates the placement/attachment of devices 36 (alternatively referred to as package components). The respective process is illustrated as step 206 in the process flow shown in FIG. 38. Devices 36 may be device dies, and hence are referred to as device dies 36 hereinafter, while devices 36 may also be packages, die stacks, or the like. Device dies 36 are attached to dielectric buffer layer 24 through Die-Attach Films (DAFs) 34, which are adhesive films pre-attached on device dies 36 before device dies 36 are placed on dielectric buffer layer 24. Device dies 36 may include semiconductor substrates having back surfaces (the surface facing down) in physical contact with the respective underlying DAFs 34. Devices die 36 may include integrated circuit devices such as active devices, which include transistors (not shown) at the front surface (the surface facing up) of the semiconductor substrate. In accordance with some embodiments of the present disclosure, device dies 36 include one or more logic die, which may be a Central Processing Unit (CPU) die, a Graphic Processing Unit (GPU) die, a mobile application die, a Micro Control Unit (MCU) die, an input-output (IO) die, a BaseBand (BB) die, or an Application processor (AP) die. Since carrier 20 is a wafer-level carrier, although one device die 36 is illustrated, a plurality of identical groups of device dies 36 may be placed over dielectric buffer layer 24 in the die-placement step, and the device die groups may be allocated as an array including a plurality of rows and a plurality of columns.

In accordance with some exemplary embodiments, metal pillars 42 (such as copper pillars) are pre-formed as parts of device dies 36, and metal pillars 42 are electrically coupled to the integrated circuit devices such as transistors (not shown) in device die 36 through the underlying metal pads 40, which may be, for example, aluminum pads. Although one metal pad 40 and one metal pillar 42 are illustrated as in each of devices 36, each of devices 36 may include a plurality of metal pads and a plurality of overlying metal pillars 42. In accordance with some embodiments of the present disclosure, a dielectric layer such as polymer layer 44 fills the gaps between neighboring metal pillars 42 in the same device die as a top dielectric layer. Passivation layer 43 may also be underlying polymer layer 44. Top dielectric layer 44 may also include a portion covering and protecting metal pillars 42. Polymer layer 44 may be formed of PBO or polyimide in accordance with some embodiments of the present disclosure. It is appreciated that device dies 36 may have different design including different top dielectric layers, which are contemplated by the embodiments of the present disclosure.

Figure 5:
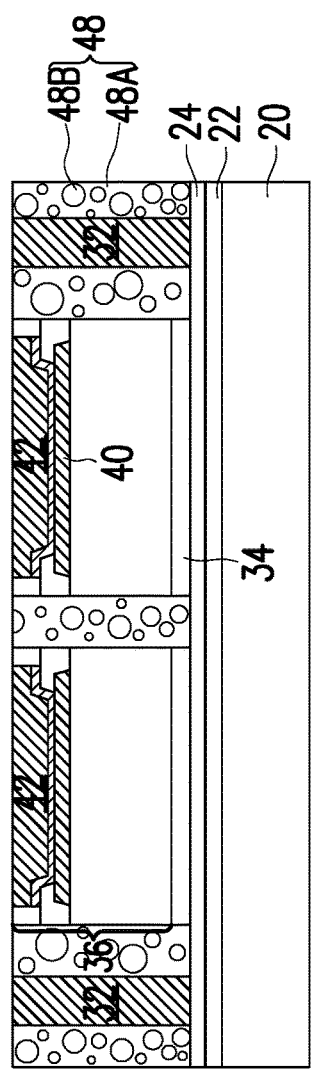

Next, referring to FIG. 5, device dies 36 and metal posts 32 are encapsulated in encapsulating material 48. The respective process is illustrated as step 208 in the process flow shown in FIG. 38. Accordingly, metal posts 32 are referred to as through-vias thereinafter. Encapsulating material 48 fills the gaps between neighboring through-vias 32 and the gaps between through-vias 32 and device dies 36. Encapsulating material 48 may be a molding compound, a molding underfill, an epoxy, and/or a resin. The top surface of encapsulating material 48 is higher than the top ends of metal pillars 42 and through-vias 32. Encapsulating material 48 may include base material 48A, which may be a polymer, a resin, an epoxy, or the like, and filler particles 48B in the base material 48A. The filler particles may be particles of a dielectric material(s) such as $SiO_2$, $Al_2O_3$, silica, or the like, and may have spherical shapes. Also, the spherical filler particles 48B may have the same or different diameters, as illustrated in accordance with some examples.

In a subsequent step, as also shown in FIG. 5, a planarization step such as a Chemical Mechanical Polish (CMP) step or a mechanical grinding step is performed to thin encapsulating material 48 and dielectric layer 44, until through-vias 32 and metal pillars 42 are all exposed. Through-vias 32 and metal pillars 42 may also be polished slightly to ensure the exposure of both through-vias 32 and metal pillars 42. Due to the planarization process, the top ends of through-vias 32 are substantially level (coplanar) with the top surfaces of metal pillars 42, and are substantially coplanar with the top surface of encapsulating material 48. Due to the planarization process, some filler particles 48B at the top of the molded encapsulating material 48 are polished partially, causing some of the filler particles to have the top portions removed, and bottom portions remaining, as shown in FIG. 5. The resulting partial filler particles will thus have top surfaces to be planar, which planar top surfaces are coplanar with the top surface of base material 48A, through-vias 32, and metal pillars 42.

Figure 6:
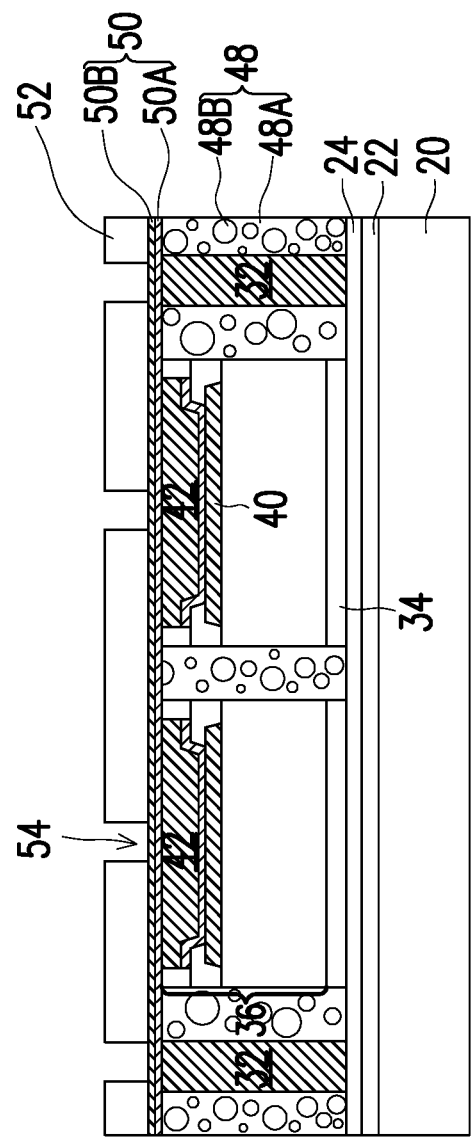

FIGS. 6 through 22 illustrate the formation of a front-side redistribution structure. FIGS. 6 through 10 illustrate the formation of vias and the respective dielectric layer. Referring to FIG. 6, metal seed layer 50 is formed as a blanket layer, which may include adhesion layer 50A and copper-containing layer 50B. The respective process is illustrated as step 210 in the process flow shown in FIG. 38. Adhesion layer 50A includes a metal different from copper, and may include titanium, tantalum, titanium nitride, tantalum nitride, or the like. Copper-containing layer 50B may be formed of pure or substantially pure (for example, with percentage greater than about 95 percent) copper or a copper alloy. Patterned photo resist 52 is formed over metal seed layer 50, and openings 54 are formed, for example, through a photo lithography process. The respective process is also illustrated as step 210 in the process flow shown in FIG. 38.

Figure 7:
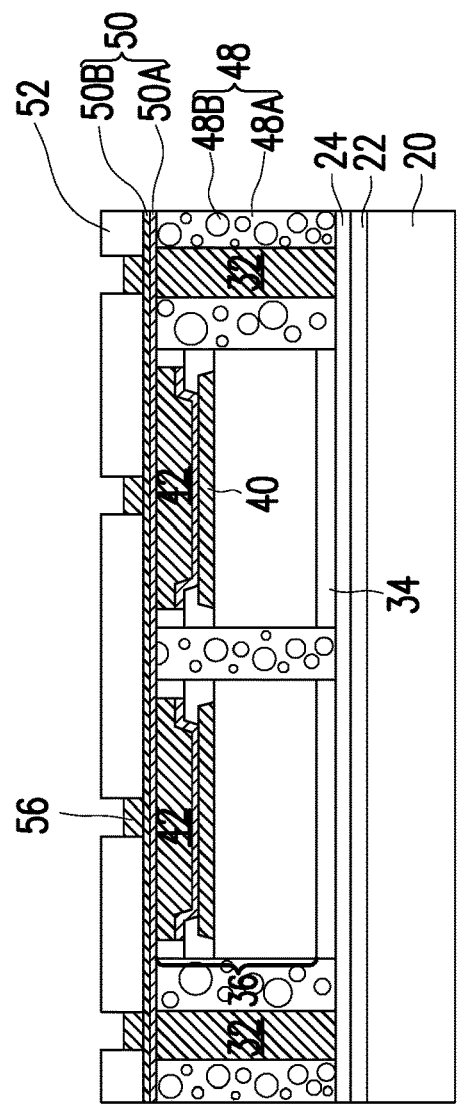

Next, as shown in FIG. 7, vias 56 are formed in openings 54, for example, through plating, which may be electrical-chemical plating. The respective process is illustrated as step 212 in the process flow shown in FIG. 38. Vias 56 may be formed of copper or a copper alloy. After the plating for forming vias 56, photo resist 52 is removed. The respective process is illustrated as step 214 in the process flow shown in FIG. 38.

Next, a three-step etching process is performed. In the first of the three-step etching process, the portions of copper-containing layer 50B directly underlying the removed photo resist 52 are removed. The respective process is illustrated as step 216 in the process flow shown in FIG. 38. The etching may be wet etching or dry etching, and may be an isotropic etching process. The etching chemical may include a mixture of $H_3PO_4$, $H_2O_2$, and $H_2O$, a mixture of $H_2SO_4$, $H_2O_2$, and $H_2O$, a mixture of $(NH_4)_2S_2O_8$ and $H_2O$, a HCl solution, a mixture of HCl and $CuCl_2$, a $FeCl_3$ solution, and combinations thereof.

After the etching of copper-containing layer 50B, adhesion layer 50A is exposed. A second etching process is then performed. The respective process is illustrated as step 218 in the process flow shown in FIG. 38. Adhesion layer 50A may be etched using wet etching. The etching chemical/solution is selected to attack adhesion layer 50A, and does not attack copper-containing seed layer 50B and vias 56. The etching chemical/solution may include acidic or basic chemical/solutions such as the solution of HF, a mixture of $HF/H_2O_2$, $H_2O_2$ (with some other additives), $NaHCO_3$, NaOH, a mixture of $NaHCO_3/H_2O_2$, a mixture of $NaHCO_3/NaOH/H_2O_2$, or an alkali metal hydroxide aqueous solution. The alkali metal hydroxide aqueous solution may be the solution of NaOH, KOH, or the like. Throughout the description, the remaining portions of copper seed layer 50B and the overlying vias 56 are in combination referred to as vias 60.

Figure 8:
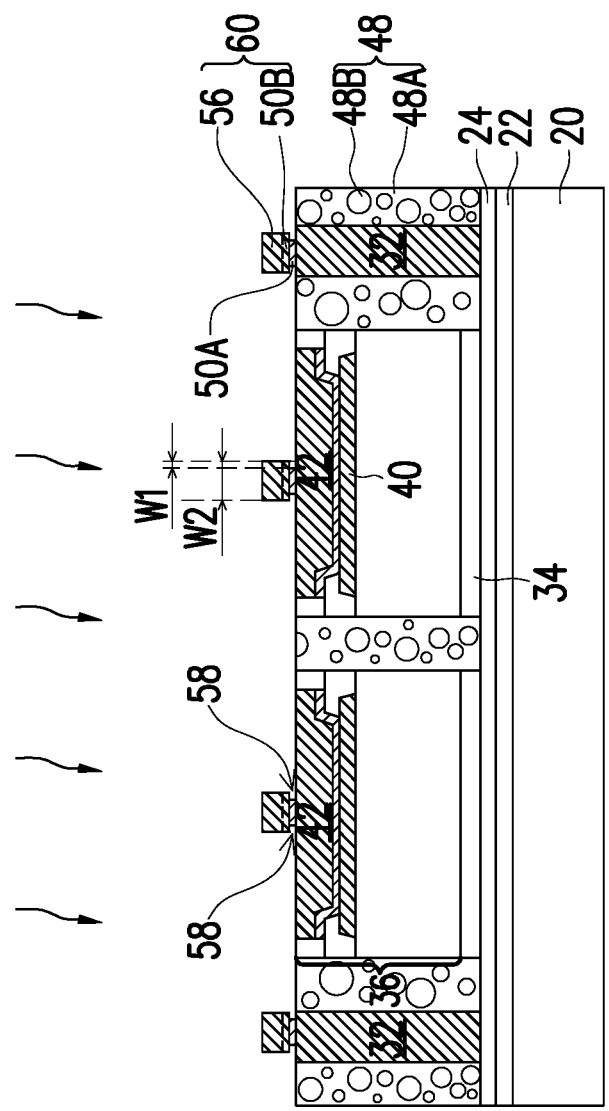

As shown in FIG. 8, there are undercuts 58 formed directly underlying the edge portions of vias 60, which undercuts 58 are caused by the lateral over-etching of adhesion layer 50A. In accordance with some embodiments of the present disclosure, the width W1 of undercuts 58 is greater than about 0.1 μm, and may between about 0.1 μm and about 0.5 μm, depending on the etch selectivity and etch ability of the respective etchant. The undercuts cause the degradation of the reliability of vias 60, particularly when vias 60 have a small pitch, for example, smaller than a threshold pitch, which maybe in the range between about 1 μm and about 6 μm (such as about 4 μm), and/or the widths W2 of vias 60 are smaller than about 2 μm. The pitch may be the distance between the middle lines of neighboring features, the distance between the left edges of neighboring features, or the distance between the right edges of neighboring features. When widths W1 of undercuts 58 are greater than 10% of the W2 of vias 60, the undercuts may cause the deformation and/or delamination of vias 60.

In accordance with some embodiments of the present disclosure, a re-etching process (the third etching step in the three-step etching) is performed to reduce the lateral dimensions of vias 60, so that there are no undercuts under the reduced vias 60. The respective process is illustrated as step 220 in the process flow shown in FIG. 38. The re-etching is such named since vias 56 and copper-containing layer 50B have already been etched in the first etching step. The etching chemical/solution is selected to attack vias 60, and does not attack adhesion layer 50A. The etching chemical may include a mixture of $H_3PO_4$, $H_2O_2$, and $H_2O$, a mixture of $H_2SO_4$, $H_2O_2$, and $H_2O$, a mixture of $(NH_4)_2S_2O_8$ and $H_2O$, a HCl solution, a mixture of HCl and $CuCl_2$, a $FeCl_3$ solution, and combinations thereof. The etching chemical may be acidic including some of the aforementioned acidic chemicals. The etching may be wet etching and may be an isotropic etching process. In the re-etching, vias 60 are laterally shrunk more than adhesion layers 50A, and hence the undercuts are at least reduced or eliminated. After the re-etching process, there may be zero-undercut (for example, with the width of the undercuts being zero, or smaller than about 0.1 μm). With the zero undercut, the edges of vias 60 may be flush or substantially flush with the edges of the underlying adhesion layers 50A. Due to process variations, some of adhesion layers 50A may have edges flush with the edges of the respective overlying vias 60, while some other adhesion layers 50A in the same package may extend laterally beyond the edges of the respective overlying vias 60 (which effects are referred to as footing). Removing the undercuts causes the improvement in the reliability of vias 60.

Figure 9:
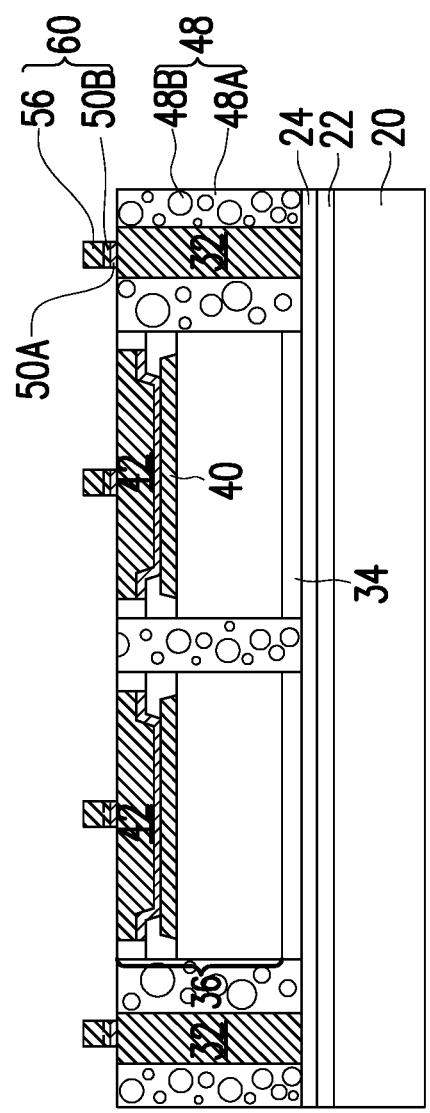

In accordance with some embodiments of the present disclosure, to determine the desirable process conditions for generating zero-undercuts, the process conditions for etching vias 60 may be determined through experiments. For example, a plurality of sample wafers may be manufactured, and the structure including vias 60 having undercuts are formed in the sample wafers. It is realized that the amount of undercut is related to the materials of vias 60 and adhesion layer 50A, and related to the process conditions for etching adhesion layer 50A and vias 60. Accordingly, the plurality of sample wafers are etched using different process conditions, which include, for example, different etching durations, different concentrations of the etching chemicals, different temperatures, different etching chemicals, or the like, so that the process conditions that can result in zero-undercuts may be determined. The process conditions for forming vias 60 and etching vias 60 are then used to forming vias 60 on production wafers for mass production. The resulting vias 60 having zero-undercuts are illustrated in FIG. 9.

Figure 10:
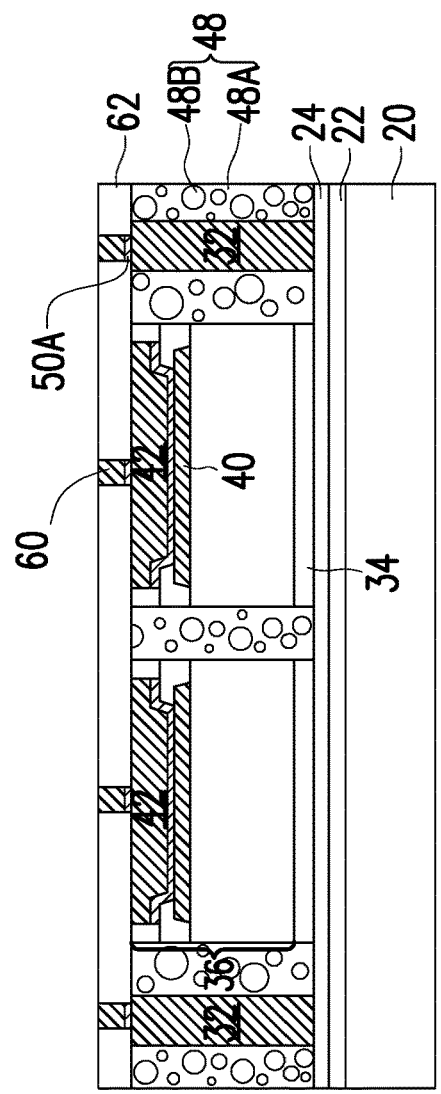

Referring to FIG. 10, dielectric layer 62 is formed. In accordance with some embodiments of the present disclosure, dielectric layer 62 is formed of a polymer such as PBO, polyimide, or the like. The formation includes coating dielectric layer 62 having a flowable form, and then curing dielectric layer 62. In accordance with alternative embodiments of the present disclosure, dielectric layer 62 is formed of an inorganic dielectric material such as silicon nitride, silicon oxide, or the like. The formation method may include Chemical Vapor Deposition (CVD), Atomic Layer Deposition (ALD), Plasma-Enhanced Chemical Vapor Deposition (PECVD), or other applicable deposition methods. A planarization process such as a CMP process or a mechanical grinding process is then applied to planarize the top surfaces of vias 60 and dielectric layer 62. The respective process is illustrated as step 222 in the process flow shown in FIG. 38.

Figure 11:
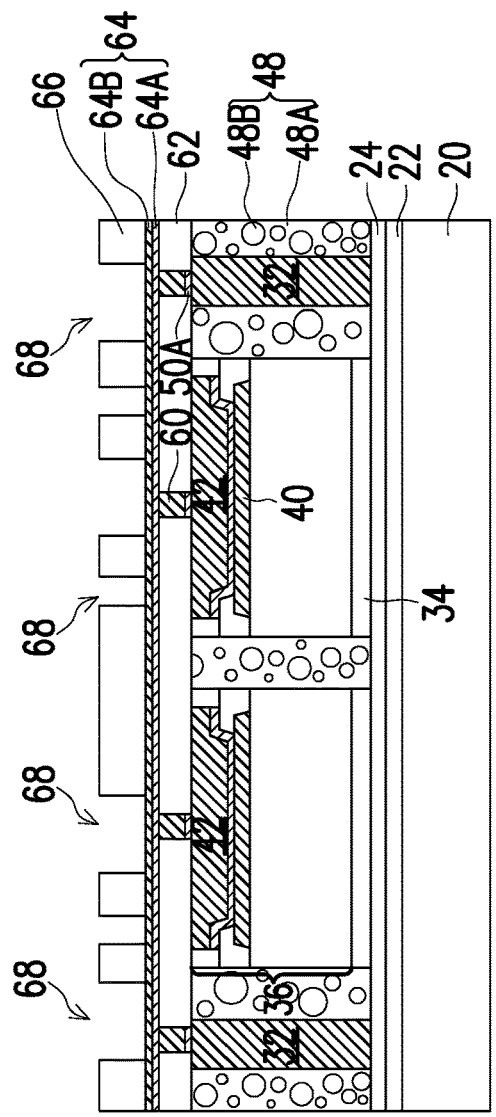

Next, FIGS. 11 through 18 illustrate the formation of metal lines and the overlying vias. Referring to FIG. 11, metal seed layer 64 is formed. The respective process is illustrated as step 224 in the process flow shown in FIG. 38. Metal seed layer 64 is formed as a blanket layer, which may include adhesion layer 64A and copper-containing layer 64B. The adhesion layer 64A includes a metal different from copper, and may include titanium, tantalum, titanium nitride, tantalum nitride, or the like. Patterned photo resist 66 is formed over metal seed layer 64, and openings 68 are formed, for example, through light-exposure and development. The respective process is also illustrated as step 224 in the process flow shown in FIG. 38.

Figure 12:
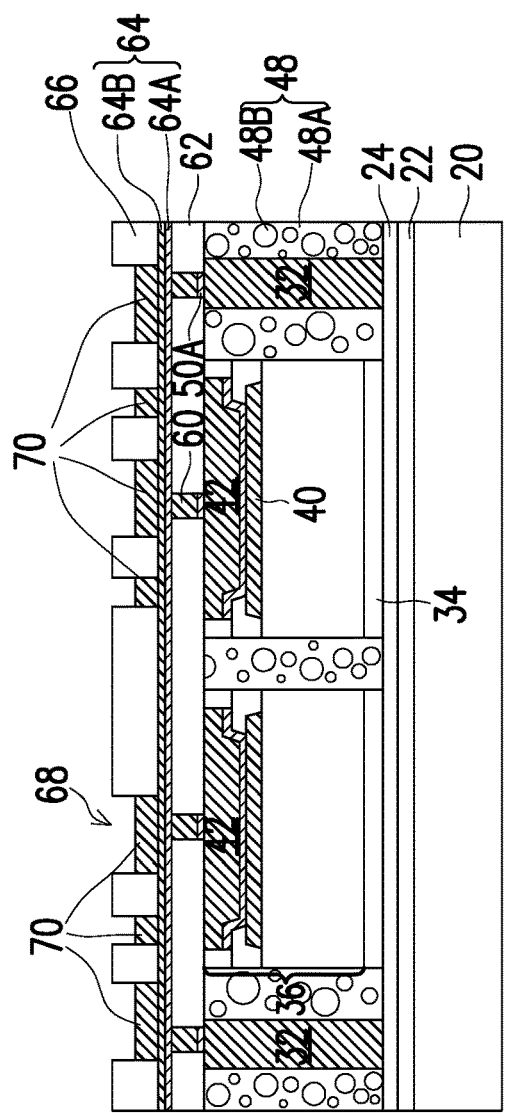
Figure 13:
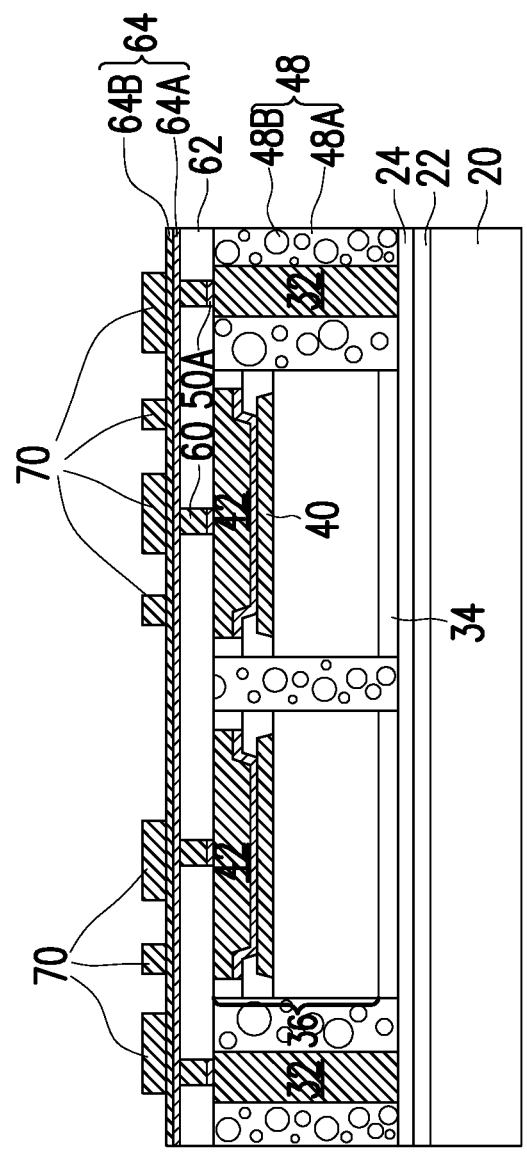

Next, as shown in FIG. 12, metal lines 70 are formed in openings 68, for example, through plating, which may be electrical-chemical plating. The respective process is illustrated as step 226 in the process flow shown in FIG. 38. Metal lines 70 may be formed of copper or a copper alloy. After the plating for forming metal lines 70, photo resist 66 is removed, and the resulting structure is shown in FIG. 13. The respective process is illustrated as step 228 in the process flow shown in FIG. 38.

Figure 14:
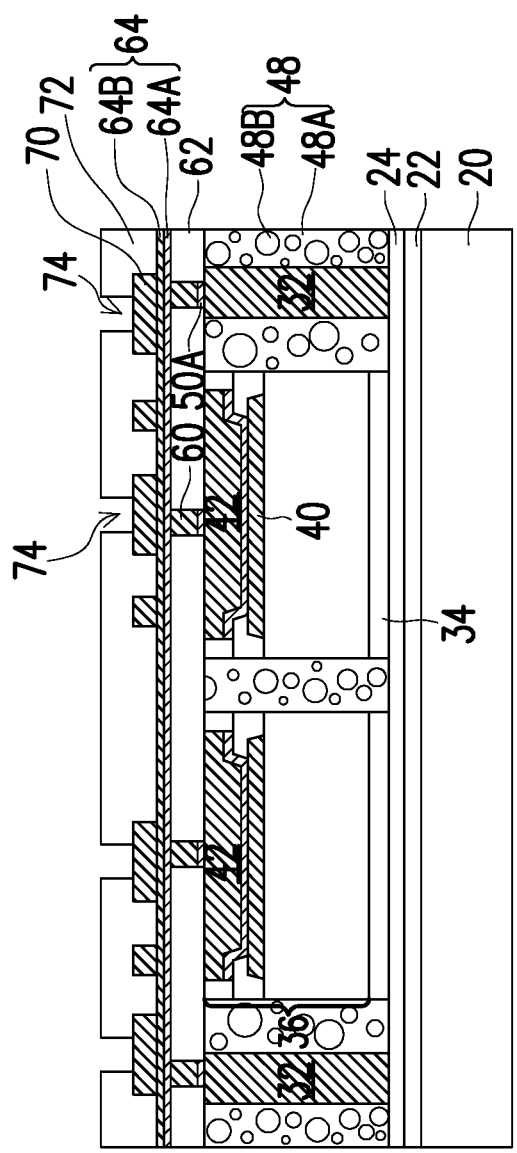
Figure 15:
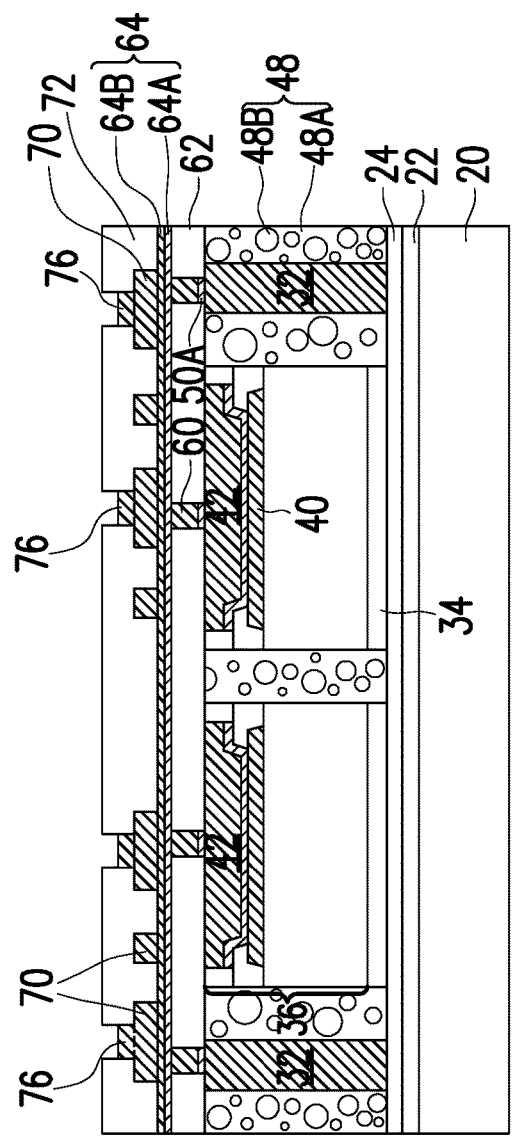

Next, referring to FIG. 14, without etching metal seed layer 64, photo resist 72 is formed and patterned to form openings 74, through which metal lines 70 are exposed. The respective process is illustrated as step 230 in the process flow shown in FIG. 38. In a subsequent step, as shown in FIG. 15, vias 76 are formed in openings 74, for example, through plating. The respective process is illustrated as step 232 in the process flow shown in FIG. 38. Vias 76 may be formed without forming another blanket seed layer since the blanket seed layer 64 still exists at this time to serve as a blanket conductive layer. Vias 76 may be formed of a homogenous material, which may be copper or a copper alloy. Dashed lines are shown to mark where metal lines 70 join the overlying vias 76.

Figure 16:
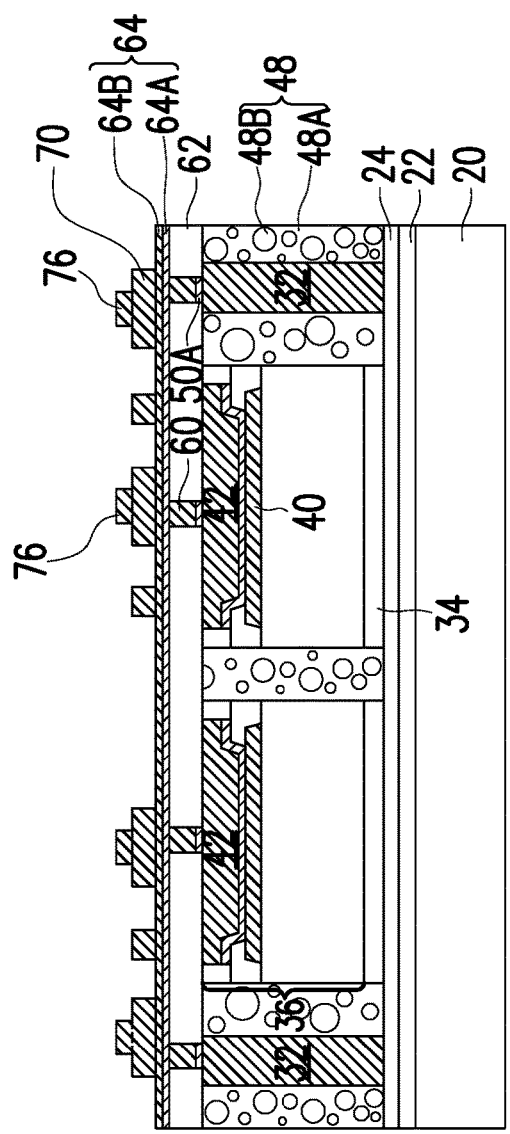
Figure 17:
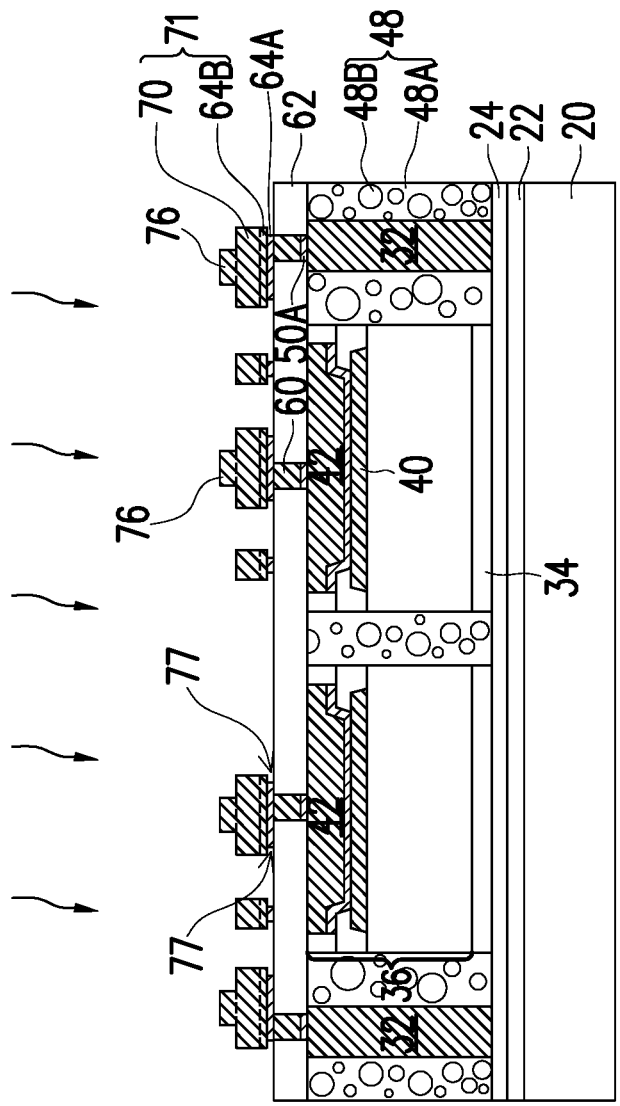

Photo resist 72 is then removed, revealing the underlying portions of metal seed layer 64. The resulting structure is shown in FIG. 16. The respective process is illustrated as step 234 in the process flow shown in FIG. 38. Next, a first etching step and a second etching step of another three-step etching process are performed, forming the structure shown in FIG. 17. Copper-containing layer 64B is etched in a first etching process. The respective process is illustrated as step 236 in the process flow shown in FIG. 38. The etching may be an isotropic etching using a chemical that attacks copper-containing layer 64B (and metal lines 70 and vias 76), and does not attack adhesion layer 64A. A second etching process is then performed, in which adhesion layer 64A is etched. The respective process is illustrated as step 238 in the process flow shown in FIG. 38. The etching may be an isotropic etching using a chemical that attacks adhesion layers 64A, and does not attack metal lines 70 and vias 76. The details for etching layers 64A and 64B may be found in the discussion of the etching of layers 50A and 50B, respectively (FIG. 8), and are not repeated herein. In the resulting structure, the portions of copper-containing layer 64B and the overlying metal lines 70 are in combination referred to as metal lines 71. Undercuts 77 may be formed under metal lines 71.

Figure 18:
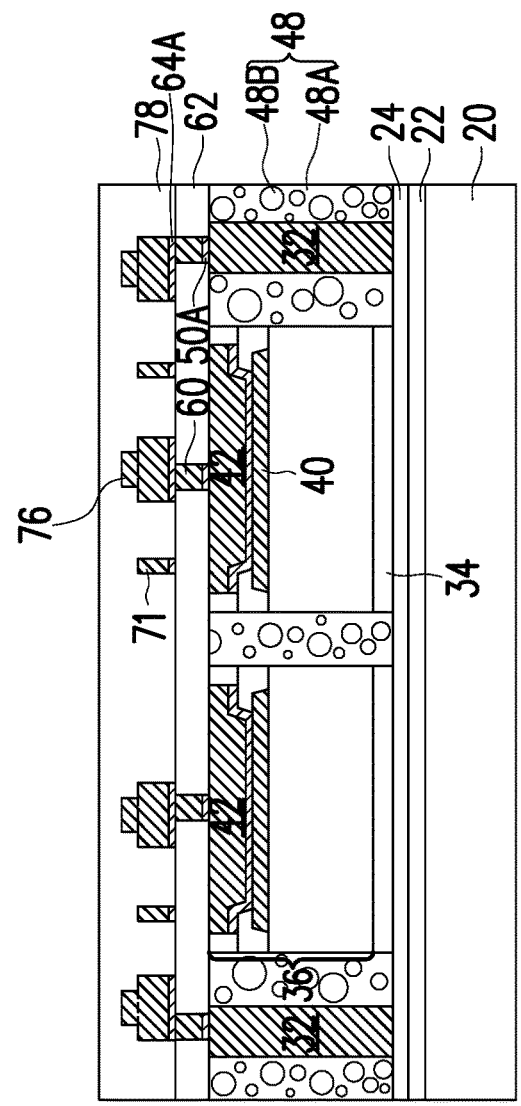

Next, in the third etching step, metal lines 71 and vias 76 are re-etched to eliminate, or at least reduce, undercuts 77. The respective process is illustrated as step 240 in the process flow shown in FIG. 38. The resulting structure is shown in FIG. 18. The etching may be an isotropic etching using a chemical that attacks metal lines 71 and vias 76 simultaneously, and does not attack adhesion layers 64A. The etching chemicals and the process conditions, and the process for determining the optimal etching process conditions are similar to that for forming vias 60, and may be found in the discussion of the formation of vias 60. In the etching process, the lateral dimensions of metal lines 71 and vias 76 are reduced, resulting in elimination or at least reduction of undercuts. Furthermore, the heights of metal lines 71 and vias 76 are also reduced, and the corners of metal lines 71 and vias 76 may be rounded.

Figure 19:
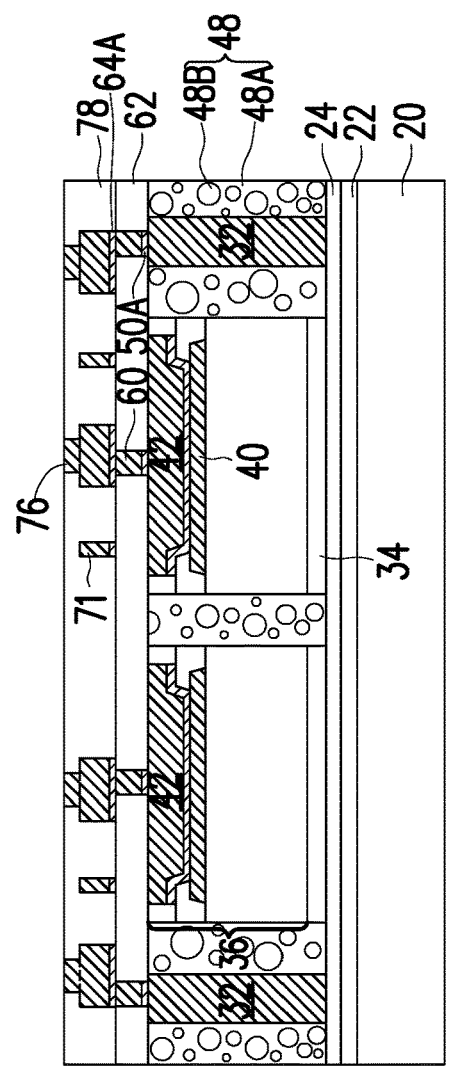

Referring to FIG. 18, dielectric layer 78 is formed. In accordance with some embodiments of the present disclosure, dielectric layer 78 is formed of a material and using a method selected from the same group of candidate materials and candidate methods for forming dielectric layer 62. The details are thus not repeated herein. A planarization process such as a CMP process or a mechanical grinding process is then performed to planarize the top surfaces of vias 76 and dielectric layer 78. The resulting structure is shown in FIG. 19.

Figure 20:
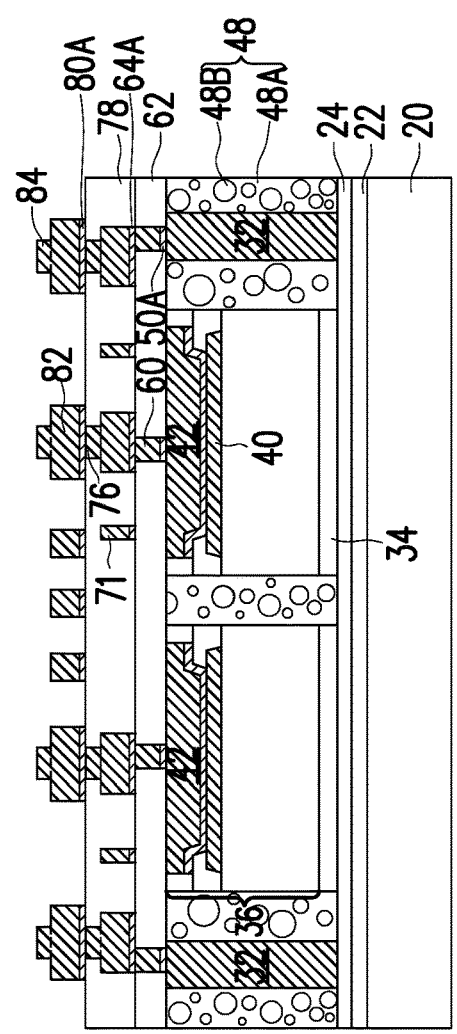
Figure 21:
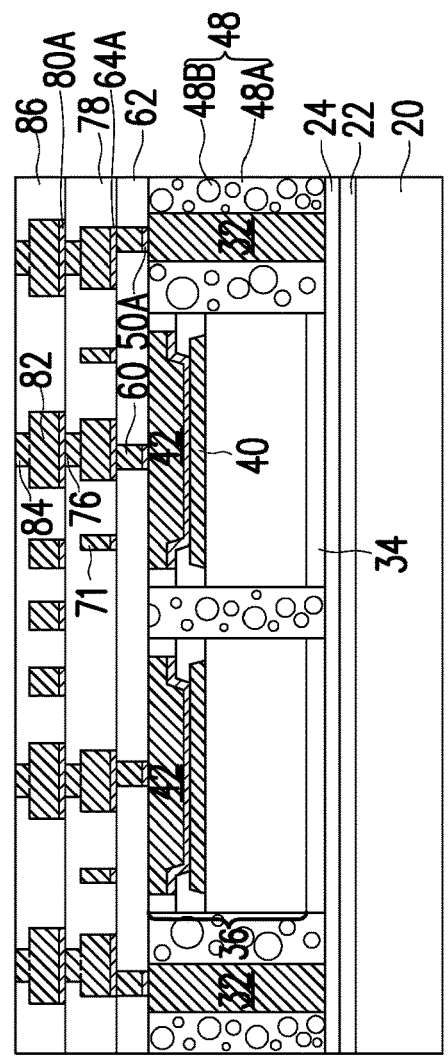

FIGS. 20 and 21 illustrate the formation of adhesion layers 80A, metal lines 82, vias 84, and dielectric layer 86. The details of the formation of adhesion layers 80A, metal lines 82, vias 84, and dielectric layers 86 may be essentially the same as the formation of metal-containing layers 64A, metal lines 71, vias 76, and dielectric layer 78, and hence are not repeated herein.

Figure 22:
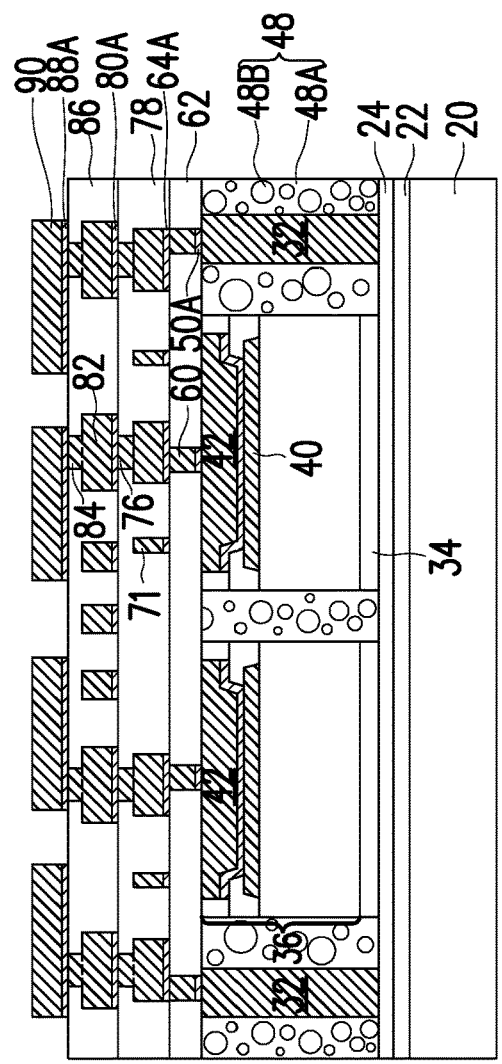
Figure 23:
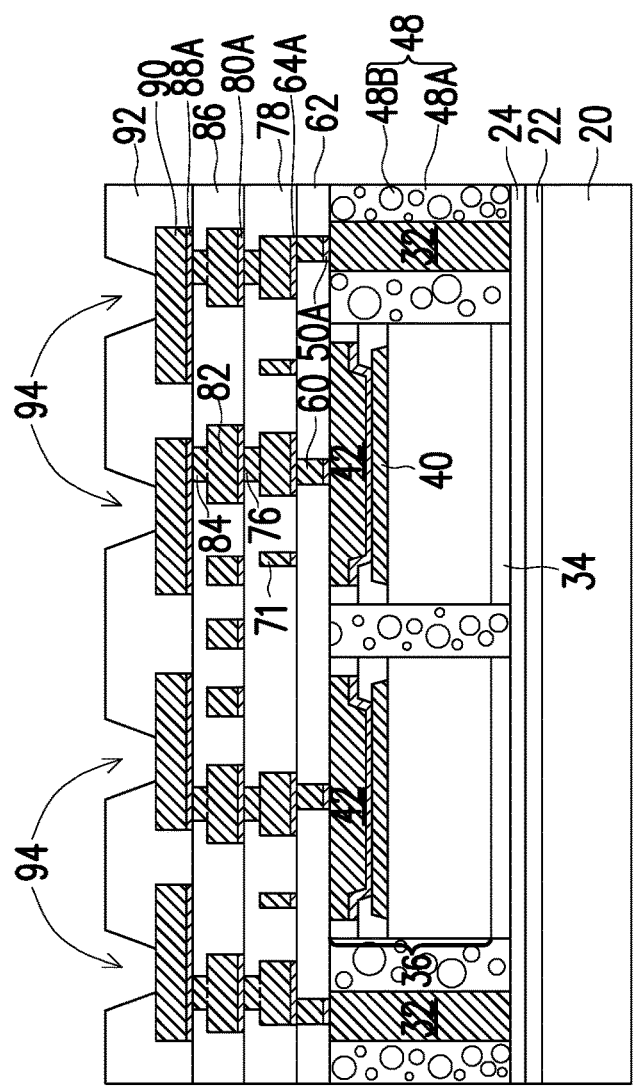

FIGS. 22 and 23 illustrate the formation of adhesion layers 88A, metal lines and metal pads (referred to as metal lines/pads hereinafter) 90, and dielectric layer 92. The details may also be essentially the same as the formation of adhesion layers 64A, metal lines 71, vias 76, and dielectric layer 78, and hence are not repeated herein. In accordance with alternative embodiments, the re-etching step of adhesion layers 88A is selectively skipped, and undercuts exist underlying metal lines/pads 90. As also shown in FIG. 23, openings 94 are formed in dielectric layer 92 to expose the metal pads in metal lines/pads 90.

Figure 24:
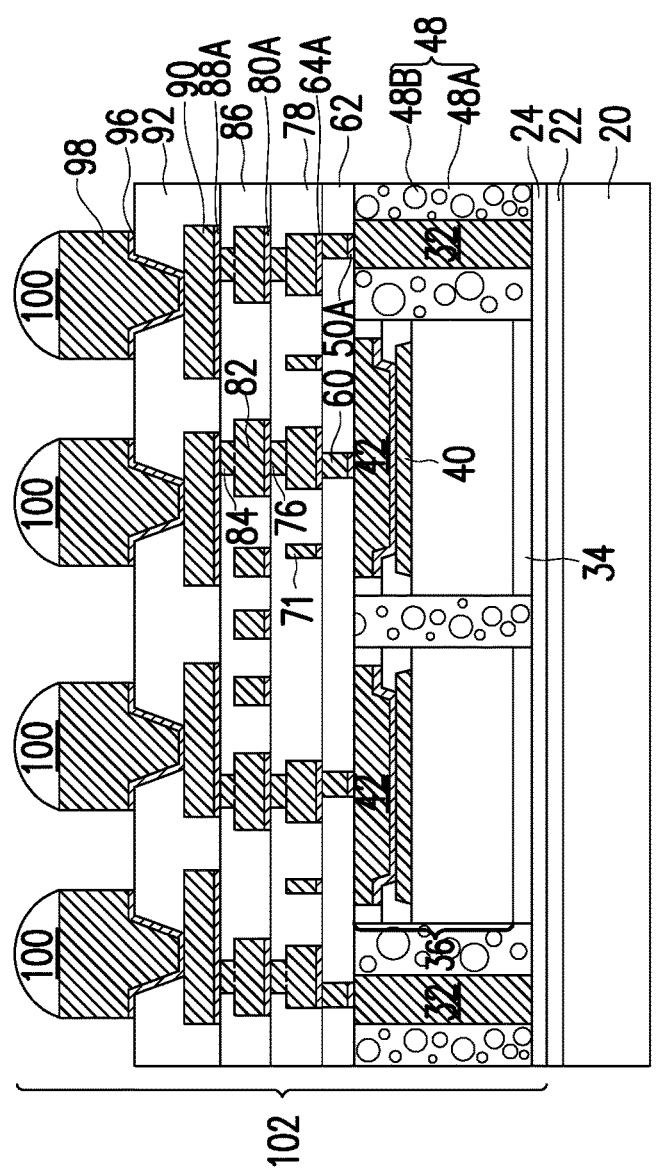

FIG. 24 illustrates the formation of Under-Bump Metallurgies (UBMs) 96 and electrical connectors 98 in accordance with some exemplary embodiments. In accordance with some embodiment of the present disclosure, UBMs 96 are formed to extend into the openings in dielectric layer 92 to contact the metal pads in metal lines/pads 90. UBMs 96 may be formed of nickel, copper, titanium, or multi-layers thereof. In accordance with some exemplary embodiments, UBMs 96 include a titanium layer and a copper layer over the titanium layer.

Electrical connectors 98 are then formed. The formation of electrical connectors 98 may include plating non-solder metal pillars, which may be copper pillars. Solder caps 100 may also be formed, which may be plated and then reflowed. Throughout the description, the structure including all components overlying release film 22 in combination is referred to as package 102, which may be a composite wafer (and also referred to as composite wafer 102 hereinafter) including a plurality of device dies 36.

Figure 25:
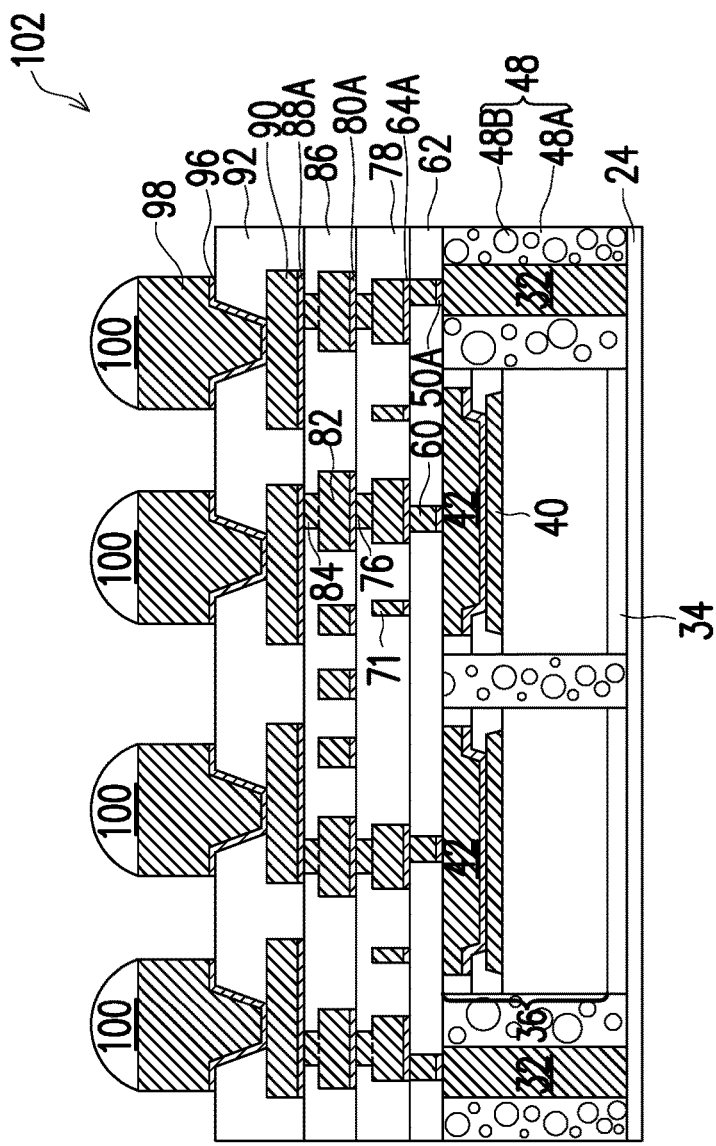

Next, composite wafer 102 may be placed on a tape (not shown), after the composite wafer 102 is demounted from carrier 20, for example, by projecting a light on release film 22, and the light (such a laser beam) penetrates through the transparent carrier 20. The release film 22 is thus decomposed, and composite wafer 102 is released from carrier 20. The resulting composite wafer 102 is shown in FIG. 25.

Figure 26:
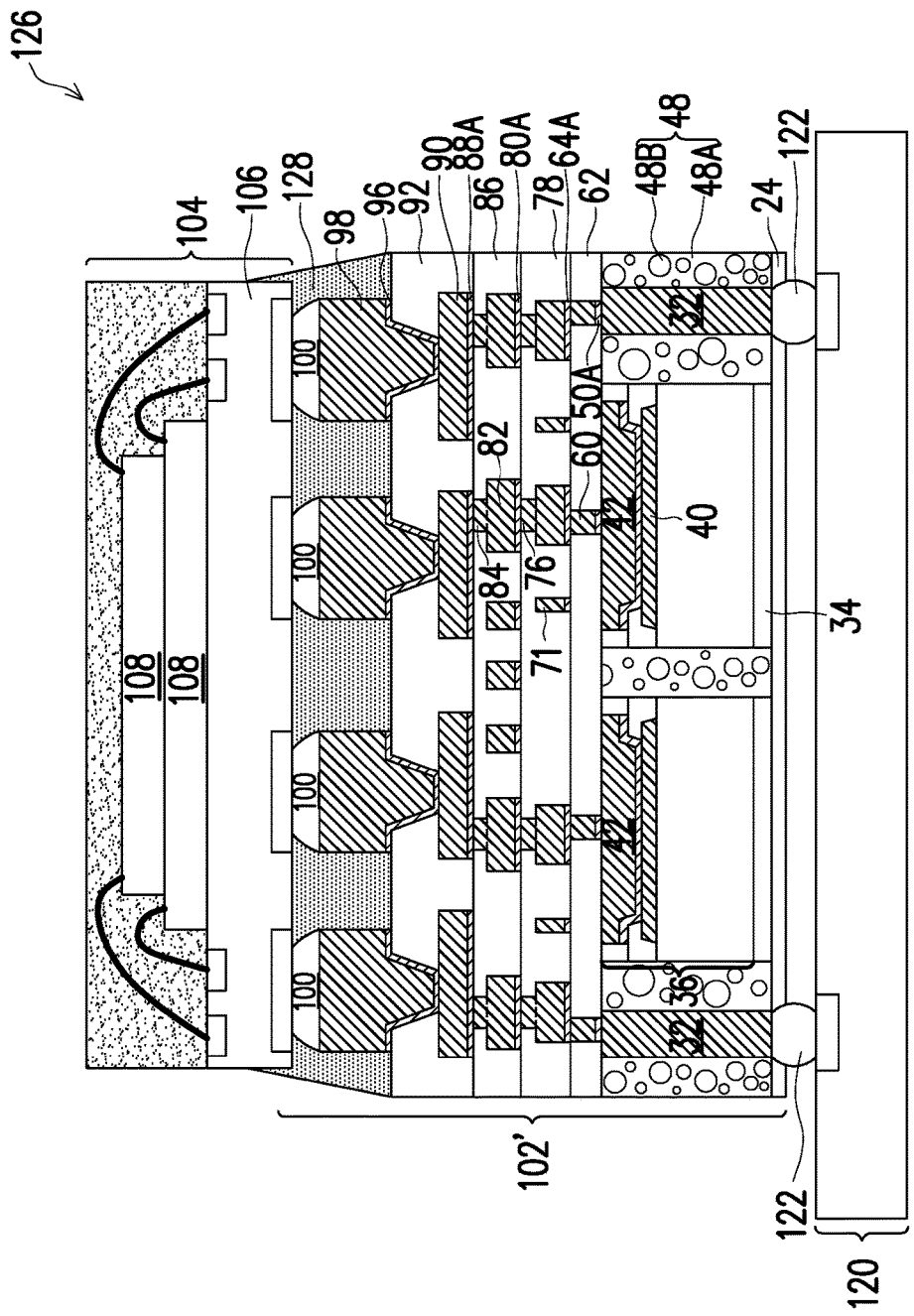

Referring to FIG. 26, openings (occupied by solder regions 122) are formed in dielectric buffer layer 24, and hence through-vias 32 are exposed. In accordance with some embodiments of the present disclosure, the openings are formed through laser drill. In accordance with alternative embodiments of the present disclosure, the openings are formed through etching in a lithography process.

Composite wafer 102 includes a plurality of packages 102' (refer to FIG. 26), which are identical to each other, with each of packages 102' including a plurality of through-vias 32 and one or more device die 36. FIG. 26 illustrates the bonding of packages 104 onto package 102', thus forming a Package-on-Package (PoP) structure/package 126. The bonding is performed through solder regions 100. In accordance with some embodiments of the present disclosure, package 104 includes package substrate 106 and device die(s) 108, which may be memory dies such as Static Random Access Memory (SRAM) dies, Dynamic Random Access Memory (DRAM) dies, or the like. Underfill 128 is also disposed into the gap between packages 104 and the underlying packages 102', and is cured.

A singulation (die-saw) process is performed to separate composite wafer 102 into individual packages, which are identical to each other. FIG. 26 also illustrates the bonding of the singulated package to package component 120 through solder regions 122. In accordance with some embodiments of the present disclosure, package component 120 is a package substrate, which may be a coreless substrate or a substrate having a core. In accordance with other embodiments of the present disclosure, package component 120 is a printed circuit board or a package. The package in FIG. 26 is referred to as package 126 hereinafter.

Figure 27:
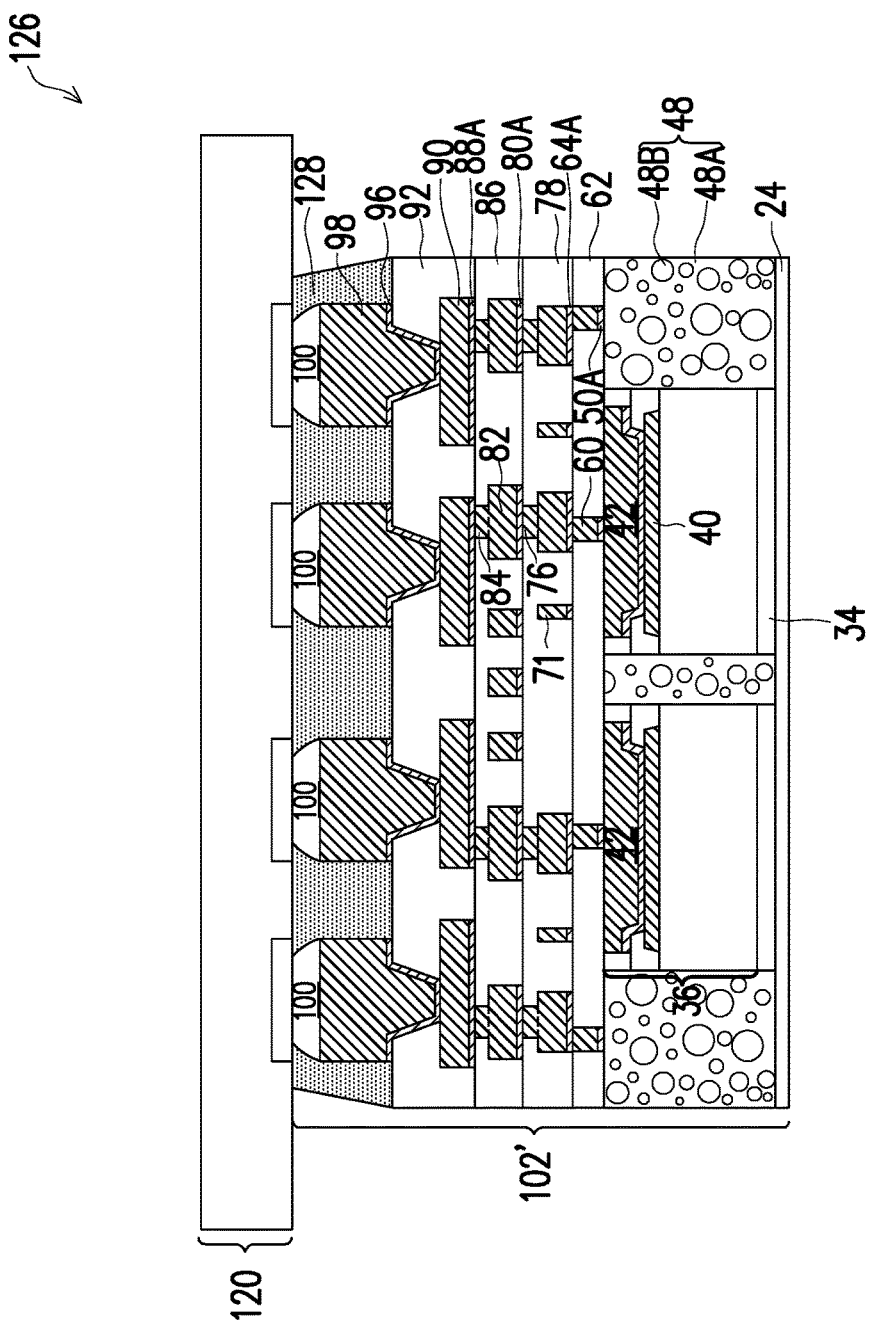
FIG. 27 illustrates a cross-sectional view of a package having no through-via in accordance with some embodiments.
Figure 28:
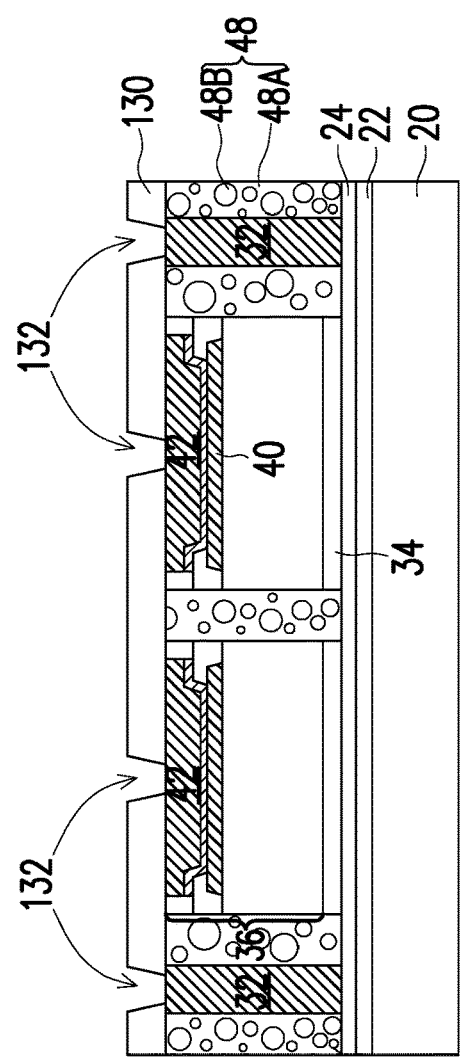
FIGS. 28 through 35 illustrate the cross-sectional views of intermediate stages in the formation of a package in accordance with some embodiments.

FIG. 27 illustrates the formation of package 126 in accordance with alternative embodiments. The package shown in FIG. 27 is similar to the package shown in FIG. 26, except that the through-vias 32 in FIG. 26 are not formed. Package component 120 is thus bonded to package 102'.

FIGS. 28 through 35 illustrate cross-sectional views of intermediate stages in the formation of a package in accordance with some embodiments of the present disclosure. Unless specified otherwise, the materials and the formation methods of the components in these embodiments are essentially the same as the like components, which are denoted by like reference numerals in the embodiments shown in FIGS. 1 through 26. The details regarding the formation process and the materials of the components shown in FIGS. 28 through 35 may thus be found in the discussion of the embodiment shown in FIGS. 1 through 26.

The initial steps of these embodiments are essentially the same as what are shown in FIGS. 1 through 5. Next, dielectric layer 130 is formed, and via openings 132 are formed in dielectric layer 130 to expose through-vias 32 and metal pillars 42. Dielectric layer 130 may be formed of a material selected from the same group of candidate materials for forming dielectric layer 62 (FIG. 10).

Figure 29:
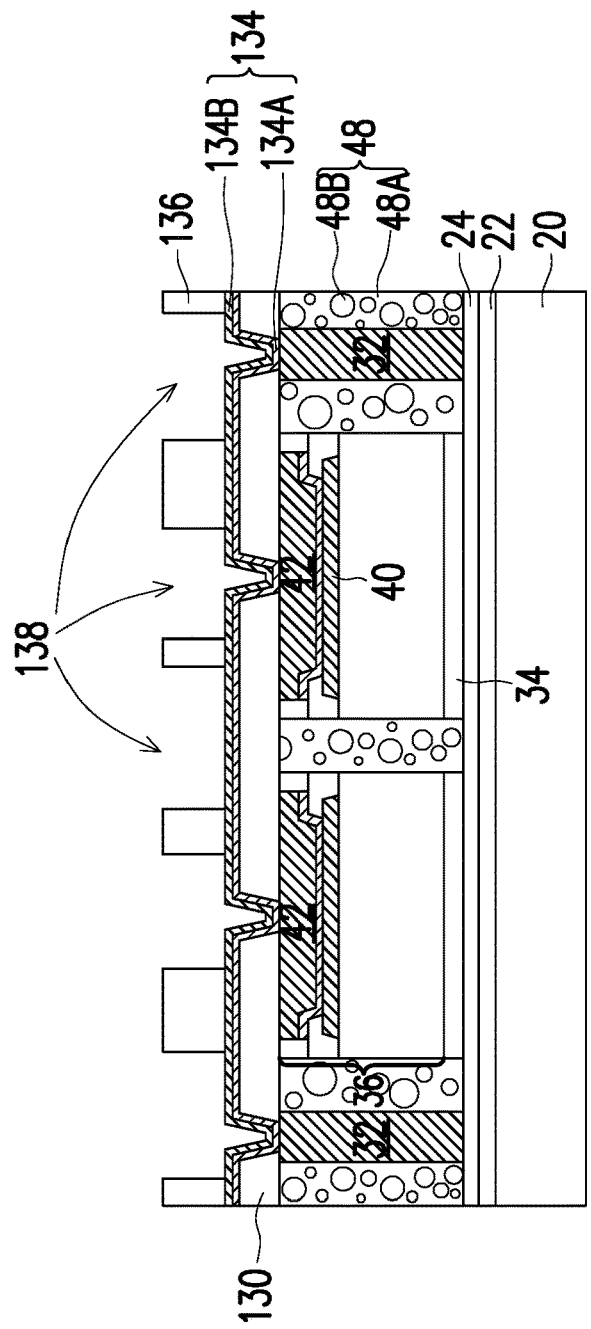
Figure 30:
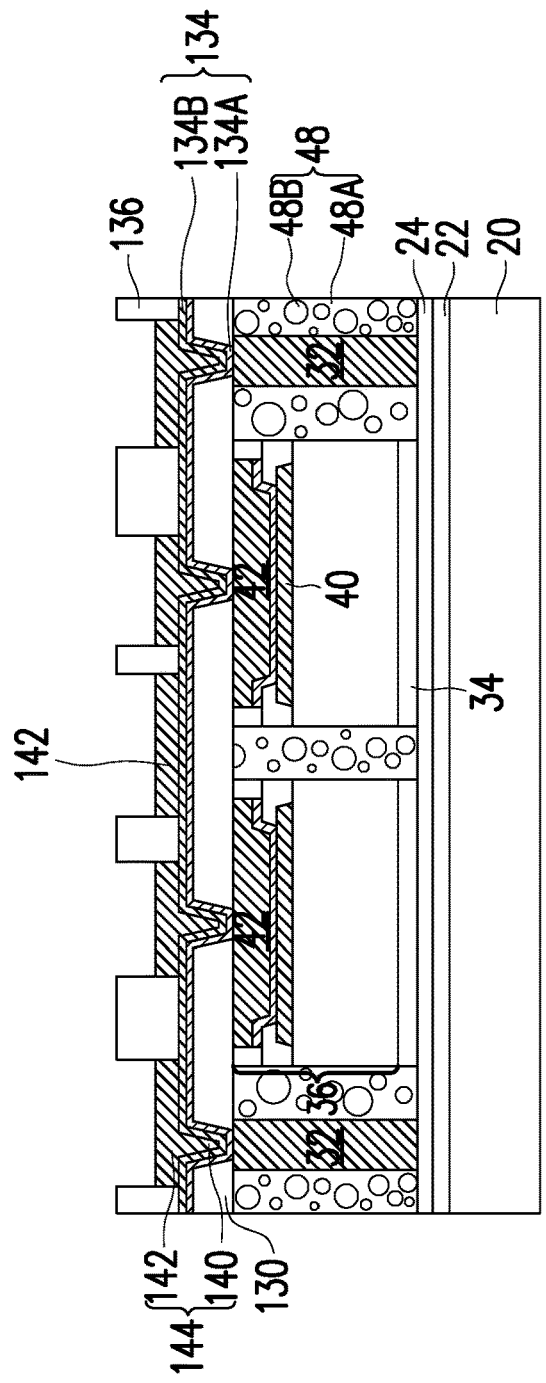

Referring to FIG. 29, metal seed layer 134 is formed, and may include adhesion layer 134A and copper-containing layer 134B. The compositions and the formation methods of adhesion layer 134A and copper-containing layer 134B may be similar to that of adhesion layer 50A and copper-containing layer 50B (FIG. 6), respectively, and hence are not repeated herein. Patterned photo resist 136 is then formed, with openings 138 formed to expose the underlying seed layer 134. Next, as shown in FIG. 30, a plating process is performed, so that vias 140 and metal lines 142 are formed on metal seed layer 134. Vias 140 and metal lines 142 are in combination referred to as redistribution lines 144 hereinafter. Vias 140 and metal lines 142 may be formed of copper or a copper alloy in accordance with some embodiments of the present disclosure.

Figure 31:
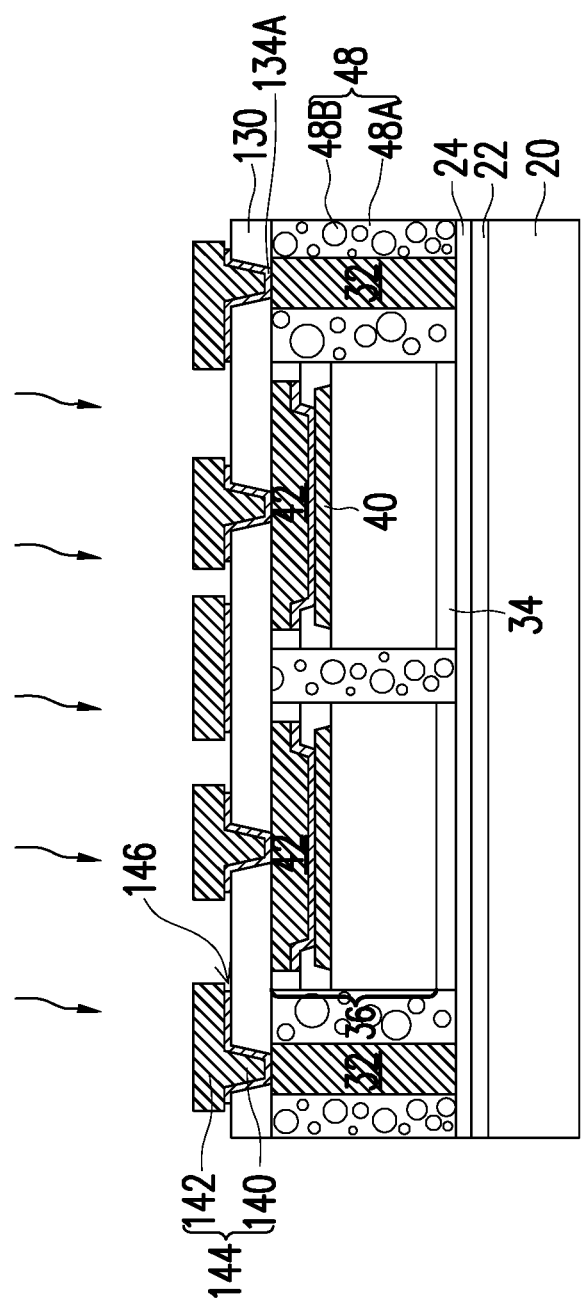

In a subsequent step, photo resist 136 is removed, and hence the underlying portions of metal seed layer 134 are exposed. A three-step etching process is then performed. First, the exposed portions of metal seed layer 134 are etched in the first and the second etching steps. The etching process conditions and the corresponding chemicals are similar to that for etching metal seed layer 50, which are discussed referring to FIGS. 7 and 8. As a result, undercuts 146 are formed, as illustrated in FIG. 31. Throughout the description, metal lines 142 and vias 140 are considered as including the remaining portions of the underlying copper-containing seed layer 134B (FIG. 29) as their bottom portions.

Figure 32:
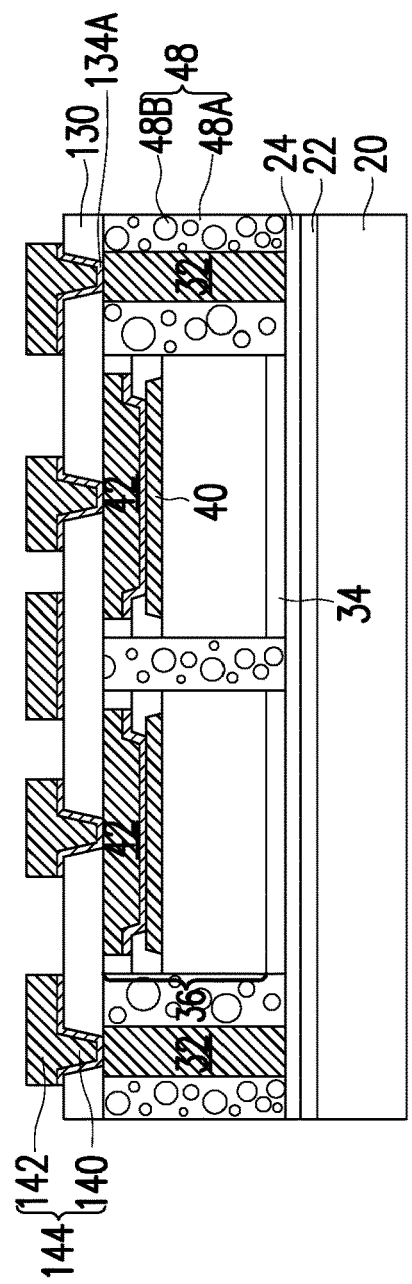

Next, a re-etching is performed in an isotropic etching process, and the resulting structure is shown in FIG. 32. The re-etching may be performed using a chemical selected from the same group of chemicals for etching metal seed layer 50, as discussed referring to the process shown in FIG. 8. The process details are thus not repeated herein. After the re-etching, the lateral dimensions of metal lines 142 are reduced, so that the edges of metal lines 142 may be flush with the respective edges of adhesion layer 134A. Undercuts 146 as shown in FIG. 31 is at least reduced, if not substantially eliminated.

Figure 33:
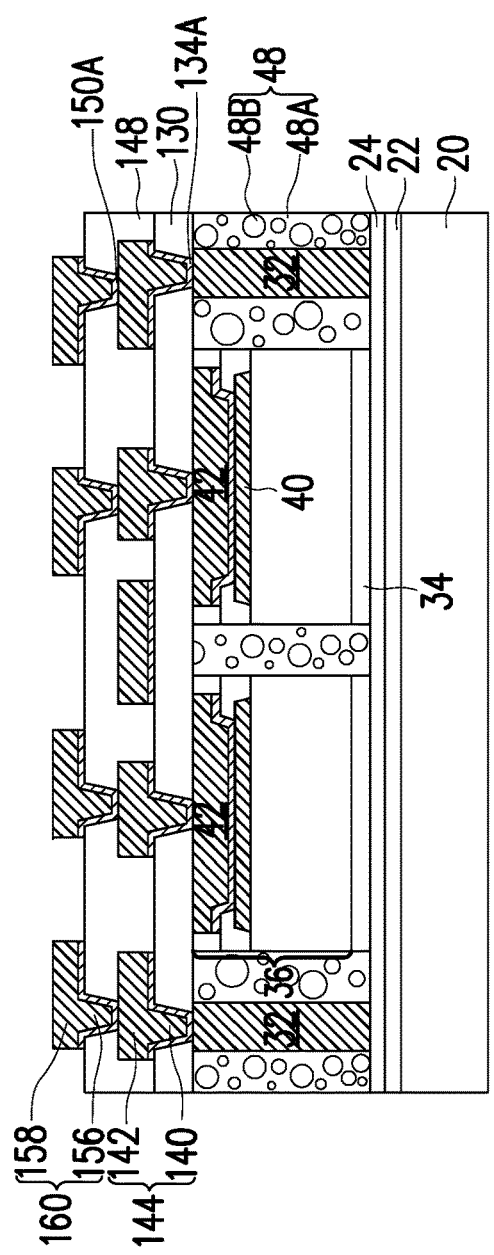

FIG. 33 illustrates the formation of dielectric layer 148, metal-containing seed layer 150A, vias 156, and metal lines 158. Vias 156 and metal lines 158 are in combination referred to as RDLs 160 hereinafter. The formation processes may be essentially the same as the processes for forming dielectric layer 130, adhesion layer 134A, vias 140, and metal lines 142, and hence the details are not discussed herein. Also, vias 156 and metal lines 158 include the remaining portions of the underlying copper-containing seed layer.

Figure 34:
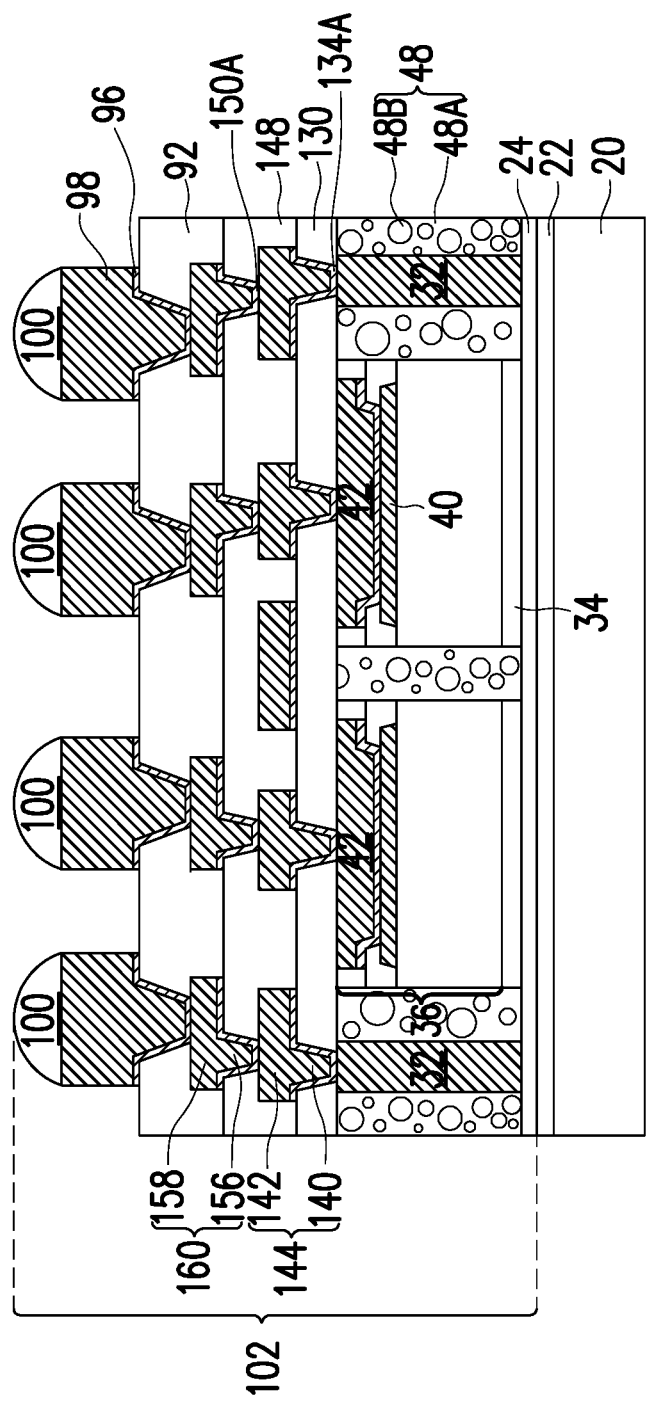
Figure 35:
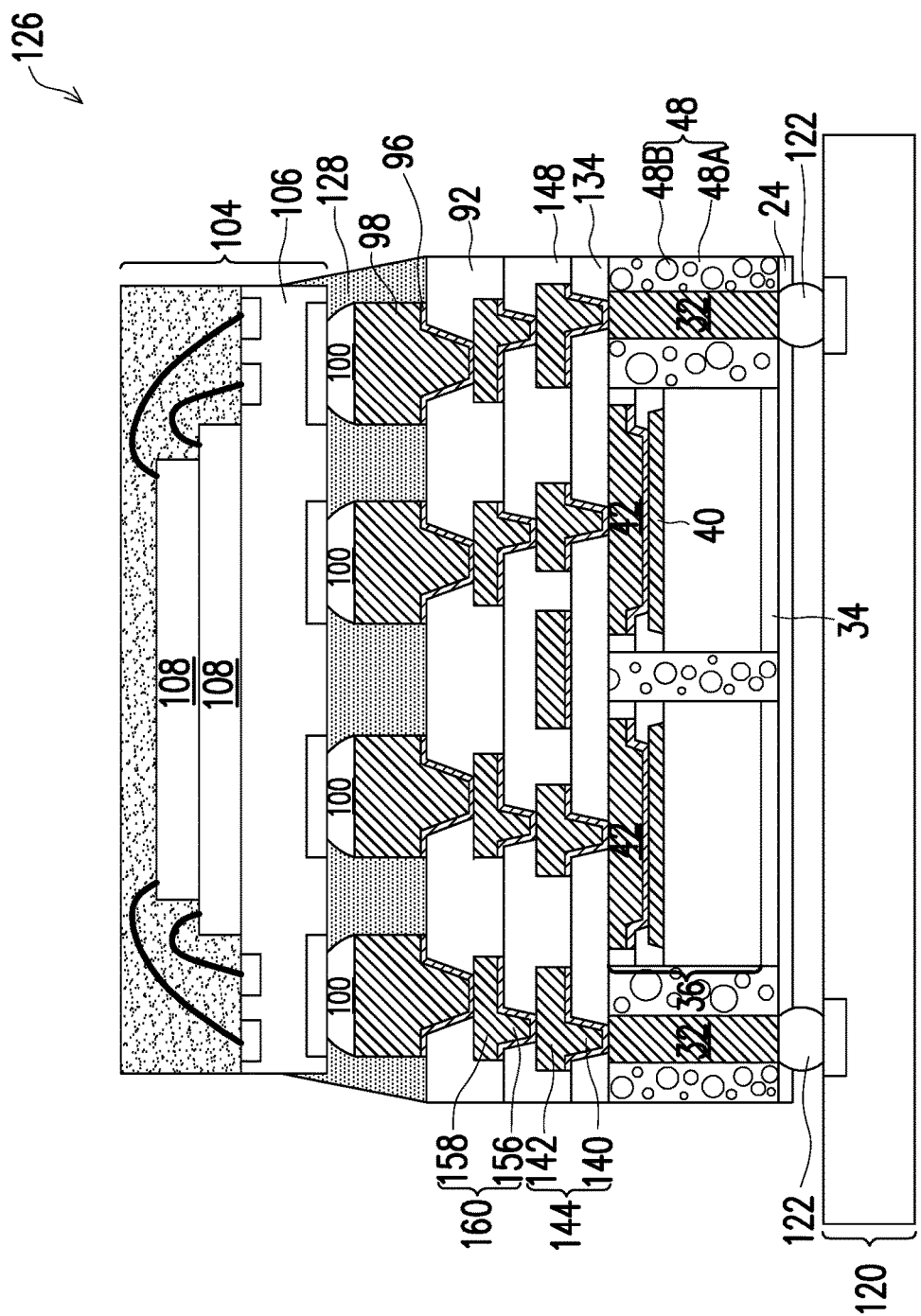

FIG. 34 illustrates the formation of dielectric layer 92, UBMs 96, metal pillars 98, and solder regions 100, thus forming composite wafer 102. In subsequent steps, composite wafer 102 is demounted from carrier 20. The subsequent steps are similar to the steps shown and discussed referring to FIGS. 25 and 26, and hence the details are not discussed herein. The resulting package 126 is shown in FIG. 35.

By re-etching copper-containing regions such as copper-containing metal lines and vias, undercuts may be eliminated or reduced, and the reliability of the resulting package is improved. Experiment results indicated that when undercuts are formed for fine-pitch metal lines and vias (for example, with pitches smaller than the threshold pitch, which may be between about 1 $\mu m$ and about 6 $\mu m$), the reliability of the resulting structure is adversely affected. On the other hand, when undercuts are formed for large-pitch metal lines and vias (for example, with pitches greater than the threshold pitch), the reliability of the resulting structure is not adversely affected. In accordance with some embodiments of the present disclosure, experiments may be performed on sample wafers to form sample conductive features such as RDLs (including metal lines and vias) and metal pads having different pitches and widths, and the reliability of the sample conductive features are tested. Accordingly, a threshold pitch may be determined, wherein the sample conductive features having pitches equal to or greater than the threshold pitch are reliable and do not suffer from deformation and delamination problem, and these sample conductive features are considered as having large-pitches. The sample conductive features having pitches smaller than the threshold pitch may suffer from deformation and delamination problem, and these sample conductive features are considered as having fine-pitches.

In accordance with some embodiments of the present disclosure, the re-etching may be performed on the small-pitch RDLs (conductive features) to eliminate/reduce undercuts, and no re-etching is performed on the large-pitch RDLs to eliminate/reduce undercuts. By distinguishing the formation of fine-pitch and large-pitch RDLs and selectively performing the re-etchings on the fine-pitch RDLs, the reliability is improved, and the manufacturing cost is not unnecessarily increased since the extra cost of re-etching on the large-pitch RDLs is saved. For example, referring to the structure shown in FIG. 26, the lower RDL layers (metal lines and vias such as 60, 71, 76 and 84 and the underlying adhesion layers) may have small pitches, and hence may be formed adopting the re-etching process, while the upper layers (such as metal lines/pads 90 and metal pillars 98) may be formed skipping the re-etching process. As a result, some of the RDLs (such as lower RDL layers) and features may not have undercuts, while some other RDLs (such as upper RDL layers and metal pillars 98) may have undercuts. In some other exemplary embodiments, for example, referring to the structure shown in FIG. 35, the lower RDL layers (metal lines and vias) (such as RDLs 144) may have small pitches, and hence may be formed adopting the re-etching process, while the upper layers (such as RDLs 160) may be formed skipping the re-etching process. As a result, some of the RDLs (such as RDLs 144) and features may not have undercuts, while some other RDLs (such as RDLs 160 and metal pillars 98) in the same package may have undercuts.

Furthermore, in the formation of a package, all RDLs and metal pads having pitches equal to or greater than the threshold pitch may be formed without the re-etching, and hence have undercuts. On the other hand, all RDLs and metal pads having pitches smaller than the threshold pitch may be formed using the three-step etching.

Figure 36B:
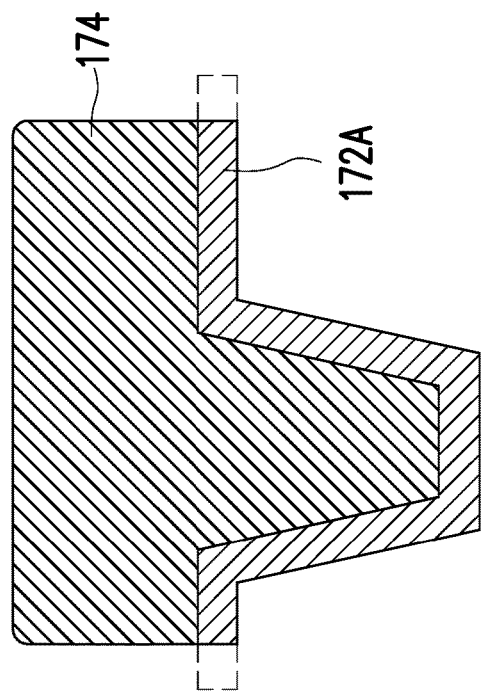
FIGS. 36A, 36B, and 37 illustrate the profiles of some RDLs in accordance with some embodiments.
Figure 36A:
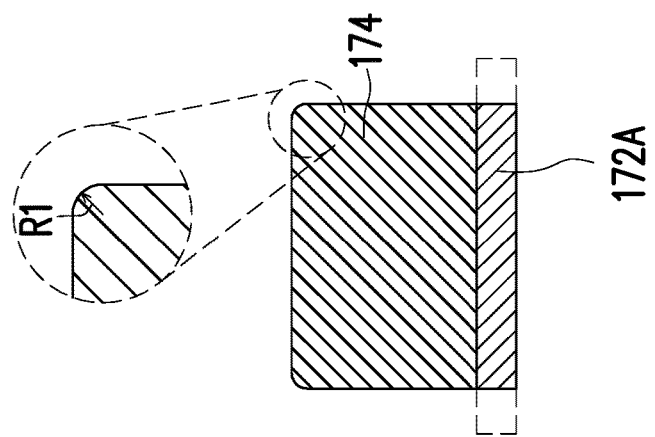
Figure 37:
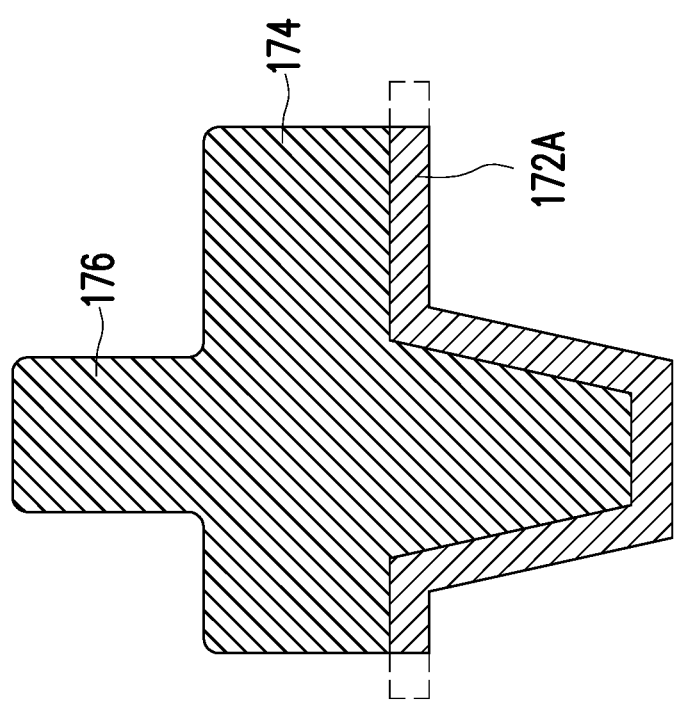

FIGS. 36A, 36B, and 37 illustrate the possible profiles of vias and metal lines in RDLs in accordance with some embodiments of the present disclosure. In FIGS. 36A, 36B, and 37, adhesion layer 172A represents the adhesion layers in the metal seed layers in the embodiments shown in FIGS. 26 and 35, and feature 174 represents the metal lines and vias in RDLs in the embodiments shown in FIGS. 26 and 35. In the re-etching for reducing undercuts, since corner regions of feature 134 are etched more than the planar surfaces, the corners of feature 174 are rounded. In accordance with some embodiments of the present disclosure, radius R1 of the rounded corners may be greater than about 0.05 μm, and may be in the range between about 0.05 μm and about 1 μm, depending on the requirement for eliminating the undercut, and the dimension of feature 174. On the other hand, the RDLs on which no re-etching is performed have sharper corners, even if in the same package as feature 174.

Also, in FIGS. 36A, 36B, and 37, dashed lines are used to represent that adhesion layer 172A may extend laterally beyond the respective edges of the overlying feature 174, which is referred to as a footing profile. This may be caused by process variations, so that some features 174 are etched more than other features 174 in the same package. For example, in a same chip, some RDLs may have zero undercut, while some other RDLs may have a footing profile.

In above-illustrated exemplary embodiments, some exemplary processes and features are discussed in accordance with some embodiments of the present disclosure. Other features and processes may also be included. For example, testing structures may be included to aid in the verification testing of the three-dimensional (3D) packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By performing three-step etching processes to form RDLs, the undercuts in the RDLs are eliminated or reduced, and the reliability of the RDLs is improved.

In accordance with some embodiments of the present disclosure, a method of forming a semiconductor device includes encapsulating a device in an encapsulating material, planarizing the encapsulating material and the device, and forming a conductive feature over the encapsulating material and the device. The formation of the conductive feature includes depositing a first conductive material to from a first seed layer, depositing a second conductive material different from the first conductive material over the first seed layer to form a second seed layer, plating a metal region over the second seed layer, performing a first etching on the second seed layer, performing a second etching on the first seed layer, and after the first seed layer is etched, performing a third etching on the second seed layer and the metal region. In an embodiment, the third etching is performed using a chemical that does not substantially attack the first seed layer. In an embodiment, the first seed layer comprises titanium, and the second seed layer comprises copper. In an embodiment, the third etching comprises a wet etching. In an embodiment, undercuts are generated by the second etching, and the third etching eliminates the undercuts. In an embodiment, the method includes forming a plurality of samples, each comprising structures similar to a structure of the conductive feature, wherein the forming the plurality of samples comprises etching the plurality of samples using different etching process conditions; and selecting from the different etching process conditions a process condition that results in a sample having a smallest undercut, wherein the forming the conductive feature is performed using the process condition. In an embodiment, the plating the metal region comprises a first plating process to form a metal line; and a second plating process to form a via over and joined to the metal line, wherein the via is narrower than the metal line, and during the third etching, the metal line and the via are both etched.

In accordance with some embodiments of the present disclosure, a method of forming a semiconductor device includes forming a metal seed layer comprising an adhesion layer; forming a plurality of copper-containing features over the metal seed layer; etching the metal seed layer, wherein remaining portions of the metal seed layer are overlapped by the copper-containing features, and are physically separated from each other; and performing an etch on the plurality of copper-containing features, wherein in the etch, lateral dimensions of the plurality of copper-containing features are reduced more than respective underlying portions of the adhesion layer in the remaining portions of the metal seed layer. In an embodiment, the etching the metal seed layer comprises an etch step performed using a first chemical solution, and the etch on the plurality of copper-containing features is performed using a second chemical solution different from the first chemical solution. In an embodiment, the etch on the plurality of copper-containing features is performed after the metal seed layer is etched. In an embodiment, after the etching the metal seed layer, undercuts are generated underlying edge portions of the copper-containing features, and wherein after the etch on the plurality of copper-containing features, the undercuts are reduced. In an embodiment, the undercuts are eliminated by the etch on the plurality of copper-containing features. In an embodiment, the adhesion layer is formed of a material different from a material of the copper-containing features. In an embodiment, during the etch on the plurality of copper-containing features, the adhesion layer is substantially un-etched.

In accordance with some embodiments of the present disclosure, a method of forming a semiconductor device includes depositing a titanium seed layer; depositing a copper seed layer over the titanium seed layer; forming a first patterned mask over the copper seed layer, with a first opening formed in the first patterned mask; plating a metal line in the first opening; removing the first patterned mask; forming a second patterned mask over the metal line and the copper seed layer to expose a portion of the metal line, with a second opening formed in the second patterned mask; plating a via over the metal line and in the second opening; removing the second patterned mask; performing a first etching on the copper seed layer until an exposed portion of the copper seed layer uncovered by the metal line are removed, and a portion of the titanium seed layer is exposed; performing a second etching on the titanium seed layer to remove the portion of the titanium seed layer, wherein the titanium seed layer is laterally recessed than the metal line to form an undercut; and performing a third etching on the metal line and the copper seed layer to at least reduce the undercut. In an embodiment, the undercut is eliminated by the third etching. In an embodiment, in the third etching, both the metal line and the via are etched. In an embodiment, the third etching is an isotropic etching. In an embodiment, the third etching comprises a wet etching. In an embodiment, in the third etching, the titanium seed layer is substantially un-etched.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device comprising:
    encapsulating a device in an encapsulating material;
    planarizing the encapsulating material and the device; and
    forming a conductive feature over the encapsulating material and the device, wherein the forming the conductive feature comprises:
        depositing a first conductive material to form a first seed layer;
        depositing a second conductive material different from the first conductive material over the first seed layer to form a second seed layer;
        plating a metal region over the second seed layer;
        performing a first etching on the second seed layer;
        performing a second etching on the first seed layer; and
        after the first seed layer is etched, performing a third etching on the second seed layer and the metal region.

2. The method of claim 1, wherein the first seed layer comprises titanium, tantalum, titanium nitride, or tantalum nitride, and the second seed layer and the metal region each comprise copper.

3. The method of claim 1, wherein the third etching comprises a wet etching.

4. The method of claim 1, wherein undercuts are generated by the second etching, and the third etching eliminates the undercuts.

5. The method of claim 1, wherein the conductive feature and neighboring conductive features at a same level have a pitch, and wherein the performing the third etching on the second seed layer and the metal region comprises performing the third etching on the second seed layer and metal region when the pitch is less than about 4 μm.

6. The method of claim 1, wherein the plating the metal region comprises:
    a first plating process to form a metal line; and
    a second plating process to form a via over and joined to the metal line, wherein the via is narrower than the metal line, and during the third etching, the metal line and the via are both etched.

7. The method of claim 1, wherein the first etching and the second etching are separate etching steps.

8. A method of forming a semiconductor device comprising:
    forming an adhesion layer;
    forming a plurality of copper-containing features over the adhesion layer;
    selectively etching the adhesion layer, thereby removing portions of the adhesion layer not underlying the plurality of copper-containing features and laterally undercutting portions of the adhesion layers under the plurality of copper-containing features to form undercuts; and
    selectively etching the plurality of copper-containing features to reduce the undercuts.

9. The method of claim 8, wherein the etching the adhesion layer comprises an etch step performed using a first chemical solution, and the etching on the plurality of copper-containing features is performed using a second chemical solution different from the first chemical solution.

10. The method of claim 9, wherein the plurality of copper-containing features and underlying remaining portions of the underlying adhesion layer form vias after the selectively etching the plurality of copper-containing features.

11. The method of claim 8, wherein the selectively etching the plurality of copper-containing features is performed using a chemical selected from the group consisting essentially of a mixture of $H_3PO_4$, $H_2O_2$, and $H_2O$, a mixture of $H_2SO_4$, $H_2O_2$, and $H_2O$, a mixture of $(NH_4)_2S_2O_8$ and $H_2O$, a HCl solution, a mixture of HCl and CuCl$_2$, a FeCl$_3$ solution, and combinations thereof.

12. The method of claim 11, wherein the undercuts are eliminated by the etch on the plurality of copper-containing features.

13. The method of claim 8, wherein the adhesion layer is formed of a material different from a material of the copper-containing features.

14. The method of claim 8, wherein the adhesion layer is etched using an acidic chemical, and the plurality of copper-containing features are etched using a basic chemical.

15. A method comprising:
depositing a titanium seed layer;
depositing a copper seed layer over the titanium seed layer;
forming a first patterned mask over the copper seed layer, with a first opening formed in the first patterned mask;
plating a metal line in the first opening;
removing the first patterned mask;
forming a second patterned mask over the metal line and the copper seed layer to expose a portion of the metal line, with a second opening formed in the second patterned mask;
plating a via over the metal line and in the second opening;
removing the second patterned mask;
performing a first etching on the copper seed layer until an exposed portion of the copper seed layer uncovered by the metal line are removed, and a portion of the titanium seed layer is exposed;
performing a second etching on the titanium seed layer to remove the portion of the titanium seed layer, wherein the titanium seed layer is laterally recessed than the metal line to form an undercut; and
performing a third etching on the metal line and the copper seed layer to at least reduce the undercut.

16. The method of claim 15, wherein the undercut is eliminated by the third etching.

17. The method of claim 15, wherein in the third etching, both the metal line and the via are etched.

18. The method of claim 15, wherein the third etching is an isotropic etching.

19. The method of claim 15, wherein the third etching comprises a wet etching.

20. The method of claim 15, wherein in the third etching, the titanium seed layer is substantially un-etched.

* * * * *